United States Patent
Oshio et al.

(10) Patent No.: US 9,976,080 B2
(45) Date of Patent: *May 22, 2018

(54) RARE EARTH ALUMINUM GARNET-TYPE INORGANIC OXIDE, PHOSPHOR AND LIGHT-EMITTING DEVICE USING SAME

(71) Applicant: Panasonic Intellectual Property Management Co., Ltd., Osaka (JP)

(72) Inventors: Shozo Oshio, Osaka (JP); Natsuki Sato, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 247 days.

This patent is subject to a terminal disclaimer.

(21) Appl. No.: 14/763,968

(22) PCT Filed: Feb. 27, 2014

(86) PCT No.: PCT/JP2014/001062
§ 371 (c)(1),
(2) Date: Jul. 28, 2015

(87) PCT Pub. No.: WO2014/136407
PCT Pub. Date: Sep. 12, 2014

(65) Prior Publication Data
US 2015/0361340 A1    Dec. 17, 2015

(30) Foreign Application Priority Data

Mar. 8, 2013  (JP) .................. 2013-046261
Apr. 11, 2013  (JP) .................. 2013-083002

(51) Int. Cl.
C09K 11/77  (2006.01)
H01L 33/50  (2010.01)
(Continued)

(52) U.S. Cl.
CPC ........ *C09K 11/7792* (2013.01); *C01G 25/006* (2013.01); *C01G 27/006* (2013.01);
(Continued)

(58) Field of Classification Search
CPC ............ C09K 11/7774; C09K 11/7792; C09K 11/7734; C09K 11/7721; C09K 11/7728;
(Continued)

(56) References Cited

U.S. PATENT DOCUMENTS 6,812,500 B2   11/2004  Reeh et al.
8,957,575 B2 * 2/2015  Oshio ................ C09K 11/7774
                                               252/301.4 F
(Continued)

FOREIGN PATENT DOCUMENTS

CN  102703077 A  10/2012
JP  2001-192655 A  7/2001
(Continued)

OTHER PUBLICATIONS

International Search Report for corresponding International Application No. PCT/JP2014/001062 dated May 27, 2014.
(Continued)

*Primary Examiner* — Matthew E Hoban
*Assistant Examiner* — Lynne Edmondson
(74) *Attorney, Agent, or Firm* — Renner Otto Boisselle & Sklar, LLP

(57) ABSTRACT

An inorganic oxide has a composition represented by General formula: $M_2LnX_2(AlO_4)_3$ (where M includes Ca, Ln includes Eu, and X includes at least either one of Zr and Hf). Then, a crystal structure of the inorganic oxide is a garnet-type structure. $Eu^{3+}$ in the inorganic oxide emits a plurality of bright line-like fluorescent components, and a principal bright line of the fluorescent component is present within a wavelength range of 600 nm or more to less than 628 nm.

(Continued)

Moreover, a maximum height of the bright line present within a wavelength range of 700 nm or more to less than 720 nm is less than 60% of a maximum height of the principal bright line. A phosphor composed of the inorganic oxide can emit narrowband red light with good color purity.

12 Claims, 5 Drawing Sheets

(51) Int. Cl.
*C01G 25/00* (2006.01)
*C01G 27/00* (2006.01)

(52) U.S. Cl.
CPC ........ *C09K 11/7734* (2013.01); *H01L 33/502* (2013.01); *C01P 2002/50* (2013.01); *C01P 2002/52* (2013.01); *C01P 2002/72* (2013.01); *H01L 2224/45144* (2013.01); *H01L 2224/48227* (2013.01); *H01L 2924/181* (2013.01)

(58) Field of Classification Search
CPC .............. C09K 11/7706; C09K 11/025; C01G 25/006; C01G 27/006; H01L 33/502; C04B 2235/764; C01P 2002/52
USPC ............. 252/301.4 R, 301.4 F; 313/503, 486
See application file for complete search history.

(56) References Cited

U.S. PATENT DOCUMENTS

| | | |
|---|---|---|
| 2004/0079956 A1 | 4/2004 | Kummer et al. |
| 2006/0138388 A1 | 6/2006 | Kummer et al. |
| 2008/0213151 A1 | 9/2008 | Yoshikawa et al. |
| 2011/0279022 A1 | 11/2011 | Winkler et al. |
| 2012/0112130 A1 | 5/2012 | Wu et al. |
| 2014/0084323 A1 | 3/2014 | Shimizu et al. |
| 2014/0152173 A1* | 6/2014 | Oshio ................ C09K 11/7774 313/503 |

FOREIGN PATENT DOCUMENTS

| | | |
|---|---|---|
| JP | 3503139 B2 | 12/2003 |
| JP | 2007-031503 A | 2/2007 |
| JP | 2009-544791 A | 12/2009 |
| JP | 2003-505582 A | 2/2013 |
| WO | WO 2006/049284 A1 | 5/2006 |
| WO | WO 2008/012712 A1 | 1/2008 |
| WO | WO 2009/041297 A1 | 4/2009 |
| WO | WO 2010/043287 A1 | 4/2010 |
| WO | WO 2012/009455 A1 | 1/2012 |
| WO | WO 2013/005356 A1 | 1/2013 |

OTHER PUBLICATIONS

Form PCT/ISA/237 for corresponding International Application No. PCT/JP2014/001062 dated May 27, 2014.
"Phosphor Handbook", edited by Keikoutaidougakukai, Ohmsha Ltd., Dec. 1987, p. 332 with English translation.

* cited by examiner

RARE EARTH ALUMINUM GARNET-TYPE INORGANIC OXIDE, PHOSPHOR AND LIGHT-EMITTING DEVICE USING SAME

TECHNICAL FIELD

The present invention relates to a rare earth aluminum garnet-type inorganic oxide, a phosphor, and a light-emitting device using the same.

BACKGROUND ART

Heretofore, many compounds, each of which has a crystal structure of garnet, have been known. Natural garnet is a silicate mineral, and those with high transparency have been valued as jewelry since ancient times. Then, sand of the garnet is industrially used as abrasive.

As famous garnet, there are almandine ($Fe^{2+}_3Al_2(SiO_4)_3$), grossular ($Ca_3Al_2(SiO_4)_3$), and andradite ($Ca_3Fe^{3+}_2(SiO_4)_3$). Moreover, there are also pyrope ($Mg_3Al_2(SiO_4)_3$), spessartine ($Mn_3Al_2(SiO_4)_3$), uvarovite ($Ca_3Cr_2(SiO_4)_3$), and the like.

Here, a compound represented by $Y_3Al_2(AlO_4)_3$, (which is hereinafter also referred to as YAG), is an artificial mineral synthesized based on the garnet, and is widely known as a name of yttrium aluminum garnet. Then, YAG is used for the purpose of a solid-state laser, translucent ceramics, a phosphor and the like (for example, refer to Non-Patent Literature 1). Moreover, it is known that the YAG includes many modification examples. Typical modification examples of YAG include $Tb_3Al_2(AlO_4)_3$ (for example, refer to Patent Literature 1), $Y_3Ga_2(AlO_4)_3$ (for example, refer to Non-Patent Literature 1), $Y_3Mg_2(AlO_4)(SiO_4)_2$ (for example, refer to Patent Literature 2) and the like.

Here, the "phosphor" stands for a compound that emits fluorescence by being given a stimulus such as ultraviolet excitation. Then, when extranuclear electrons of a specific atom that composes the compound are excited by the ultraviolet ray and the like and return to a ground state thereof, then visible light is emitted due to a difference in energy level. For example, rare earth ions and transition metal ions ($Ce^{3+}$, $Tb^{3+}$, $Eu^{3+}$, $Mn^{2+}$, $Mn^{4+}$, $Fe^{3+}$, $Cr^{3+}$ and the like), each of which functions as a light emission center, are contained in such a compound as YAG, whereby the phosphor is obtained.

Then, a YAG:Ce phosphor activated by $Ce^{3+}$ is particularly known as a high-efficiency phosphor, and is used in numerous light-emitting devices (for example, refer to Patent Literatures 3 and 4 and Non-Patent Literature 1). The YAG:Ce phosphor is characterized in, at a time of being irradiated with a corpuscular ray or an electromagnetic wave, being excited and emitting super short-afterglow visible light from yellow to green (for example, refer to Non-Patent Literature 1).

Meanwhile, a YAG:Eu phosphor activated by $Eu^{3+}$ is also known, and study thereof as a red phosphor for a plasma display device (PDP) is made (for example, refer to Non-Patent Literature 1).

CITATION LIST

Patent Literature

[PTL 1] Japanese Unexamined Patent Application Publication (Translation of PCT Application) No. 2003-505582
[PTL 2] International Publication No. 2010/043287
[PTL 3] Japanese Patent No. 3503139
[PTL 4] U.S. Pat. No. 6,812,500

Non Patent Literature

[NPL 1] "Phosphor Handbook", edited by Keikoutaidougakukai, Ohmsha, Ltd., December 1987, p. 332

SUMMARY OF INVENTION

Technical Problem

However, the conventional $Eu^{3+}$-activated phosphor having a garnet structure does not emit red light with a good color tone. Therefore, it has been difficult to provide a light-emitting device, which emits a red light component with a good color tone by using the conventional $Eu^{3+}$-activated phosphor having the garnet structure.

The present invention has been made in consideration of such a problem as described above, which is inherent in the prior art. Then, it is an object of the present invention to provide a rare earth aluminum garnet-type inorganic oxide and a phosphor, each of which is capable of emitting red light, which has narrowband characteristics, and further, has a good color tone, and to provide a light-emitting device using the same.

Solution to Problem

An inorganic oxide according to a first aspect of the present invention has a composition represented by General formula:

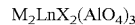

$$M_2LnX_2(AlO_4)_3$$

(where M includes Ca, Ln includes Eu, and X includes at least either one of Zr and Hf). Then, a crystal structure of the inorganic oxide is a garnet-type structure. $Eu^{3+}$ in the inorganic oxide emits a plurality of bright line-like fluorescent components, and a principal bright line of the fluorescent component is present within a wavelength range of 600 nm or more to less than 628 nm. Moreover, a maximum height of the bright line present within a wavelength range of 700 nm or more to less than 720 nm is less than 60% of a maximum height of the principal bright line.

An inorganic oxide according to a second aspect of the present invention is the inorganic oxide according to the first aspect, wherein M includes Ca and at least one element selected from the group consisting of alkali earth metal, Fe, Mn, Zn Cd, Co and Cu. Then, Ln includes Eu and at least one element selected from the group consisting of Sc, Y, La, Ce, Pr, Nd, Sm, Tb, Gd, Dy, Ho, Er, Tm, Yb, Lu, In, Sb and Bi. X includes at least either one of Zr and Hf and at least one element selected from the group consisting of Si, Ge, Ti, Sn and Pb.

An inorganic oxide according to a third aspect of the present invention is the inorganic oxide according to the second aspect, wherein M includes Ca and at least one element selected from the group consisting of alkali earth metal, Mn and Zn. Ln includes Eu and at least one element selected from the group consisting of Y, La, Ce, Pr, Sm, Tb, Gd, Lu and In. X includes at least either one of Zr and Hf and at least one element selected from the group consisting of Si, Ge, Ti and Sn.

An inorganic oxide according to a fourth aspect of the present invention is the inorganic oxide according to the first aspect, wherein M is Ca, and Ln is Eu.

An inorganic oxide according to a fifth aspect of the present invention is the inorganic oxide according to either one of the second and third aspects, wherein Ln is an element including Eu and at least one element selected from the group consisting of Y, Gd and Tb.

An inorganic oxide according to a sixth aspect of the present invention is the inorganic oxide according to the fifth aspect, wherein a number of Eu moles in 1 mol of the inorganic oxide exceeds 0 mol and is less than 0.1 mol.

A solid solution according to a seventh aspect of the present invention is a solid solution of the inorganic oxide according to any one of the first to fifth aspects and a compound that is solid-solved with the inorganic oxide and is different from the inorganic oxide in composition. Then, a number of Eu moles in 1 mol of the solid solution is 0.1 mol or more to less than 3 moles, and a crystal structure of the solid solution is the garnet-type structure.

A solid solution according to an eighth aspect of the present invention is the solid solution according to the seventh aspect, wherein the solid solution has a composition represented by General formula: $A_3D_2(EG_4)_3$ (where A includes Ca and Eu and at least one element selected from alkali metal, alkali earth metal and a rare earth element, D includes the element represented by X and at least one element selected from Mg, Sc, Y, Ti, V, Zr, Hf, Zn, Al, Ga, In, Ge and Sn, E includes Al and at least one element selected from Zn, Al, Si, Ge and P, and G includes O).

A phosphor according to a ninth aspect of the present invention is composed of the inorganic oxide according to any one of the first to sixth aspects or the solid solution according to the seventh or eighth aspect.

A phosphor according to a tenth aspect of the present invention is the phosphor according to the ninth aspect, wherein the inorganic oxide or the solid solution forms a main skeleton of a crystal.

A phosphor according to an eleventh aspect of the present invention is the phosphor according to either one of the ninth and tenth aspects, wherein a ⅕ spectrum width of a light emission spectrum serving as the principal bright line is 1 nm or more to less than 10 nm.

A light-emitting device according to a twelfth aspect of the present invention includes the phosphor according to any one of the ninth to eleventh aspects.

Advantageous Effects of Invention

The inorganic oxide of the present invention becomes the phosphor, which is capable of emitting the red light, which has the narrowband characteristics, and has good color purity. Moreover, the light-emitting device using the phosphor of the present invention is capable of emitting intense light containing a narrowband red light component in which a light emission spectrum half width is 1 nm or more to less than 10 nm.

DESCRIPTION OF EMBODIMENTS

Figure 1:
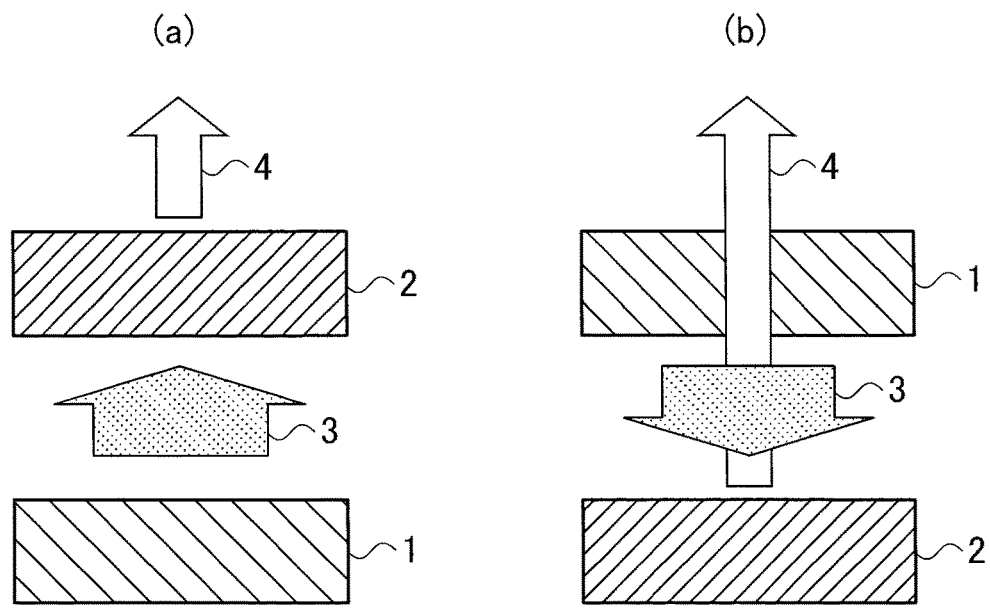
FIGS. 1A and 1B are schematic views for explaining a light-emitting device according to an embodiment of the present invention.

A description is made below in detail of a rare earth aluminum garnet-type inorganic oxide and a phosphor according to an embodiment of the present invention, and of a light-emitting device using the phosphor. Note that dimensional ratios of the drawings are exaggerated for convenience of explanation, and are sometimes different from actual ratios.

First, in general, "mineral" is a solid inorganic substance, which is naturally produced, and refers to one, in which a composition can be written by a chemical formula, an array of constituent elements is regular, that is, crystalline, and physical properties remain within a narrow range. A term opposite to the naturally produced mineral described above includes artificial mineral, which is also called man-made mineral. The artificial mineral refers to one which has the same component, structure and texture as those of the naturally produced mineral and achieved by a chemical/physical method. Note that the artificial mineral sometimes includes an inorganic solid, in which a structure and an elemental composition are the same as those of the natural mineral, and a component or a composition is different from that of the natural mineral, and in addition, more broadly, also includes a general inorganic solid in some case.

Meanwhile, it is known that elements, which are similar in charge or ion radius to one another, are substitutable for one another while keeping the same crystal structure, and accordingly, form a group of minerals having similar chemical formulae. The matter that the substances having similar chemical compositions take the same crystal structure is referred to as "isomorphism" in the field of lithology and mineralogy. Therefore, mineral species belonging to the group of the garnet are compounds isomorphic to one another.

Moreover, it is also known that a different type of ions substitutes and enters specific sites in the crystal structure, and that the mineral species exhibit a broad composition change. A composition of the mineral concerned can be easily expressed by a mixture ratio of minerals having compositions of both ends in the composition change. The mineral as described above is referred to as a "solid solution" since the mineral generates such a uniform phase as in mixture of solutions although the mineral is solid.

Then, in this description, a compound that has the crystal structure of the garnet and contains at least rare earth, aluminum and oxygen as main components is referred to as a "rare earth aluminum garnet-type inorganic oxide". Moreover, a rare earth aluminum garnet-type inorganic oxide which functions as a phosphor is referred to as a "rare earth aluminum garnet-type phosphor".

[Rare Earth Aluminum Garnet-Type Inorganic Oxide]

First, a description is made of the rare earth aluminum garnet-type inorganic oxide according to the embodiment of the present invention.

The rare earth aluminum garnet-type inorganic oxide according to this embodiment is an inorganic chemical substance created artificially with reference to natural mineral. Then, the inorganic oxide at least contains $Eu^{3+}$, in which a crystal structure is a garnet structure.

Specifically, the inorganic oxide has a composition represented by General formula (1), in which the crystal structure is the garnet structure. ($AlO_4$) in General formula (1) has a tetrahedron structure.

$$M_2LnX_2(AlO_4)_3 \quad (1)$$

where M includes calcium (Ca), Ln includes europium (Eu), and X includes at least either one of zirconium (Zr) and hafnium (Hf). Moreover, $Eu^{3+}$ in the above-described inorganic oxide emits a plurality of bright line-like fluorescent components. The fluorescent components are emitted when an external stimulus to be described later is given to $Eu^{3+}$ in the inorganic oxide. Moreover, a principal bright line of the above-described fluorescent components is present within a wavelength range of 600 nm or more to less than 628 nm. Then, a maximum height of a bright line present within a wavelength range of 700 nm or more to less than 720 nm is less than 60%, preferably, less than 40% of a maximum height of the above-described principal bright line. Here, the "principal bright line" refers to a bright line that has a maximum value within the range of 600 nm or more to less than 628 nm. The inorganic oxide of this embodiment, which is represented by General formula $M_2LnX_2(AlO_4)_3$ as described above, can exert novel fluorescent characteristics as will be described later.

Moreover, in the inorganic oxide of this embodiment, if the number of Eu atoms in General formula (1) exceeds 0 and is 1 or less, then a function as the phosphor is observed. However, in order to form the inorganic oxide into a phosphor in which a feature is conspicuous in terms of composition, it is preferable that the number of Eu atoms be 0.1 or more to 1 or less. In a case of using the inorganic oxide in which the number of Eu atoms is set within this range as the phosphor, the phosphor becomes capable of emitting red light efficiently since Eu functions as a light emission center as will be described later.

Specifically, the rare earth aluminum garnet-type inorganic oxide of this embodiment contains low-concentration or high-concentration Eu, and thereby functions as fluorescent mineral (that is, as an inorganic phosphor). Note that the expression "the number of Eu atoms in General formula (1) is 0.1 or more to 1 or less" is also presentable as an expression "the number of Eu moles in 1 mol of the inorganic oxide represented by General formula (1) is 0.1 mol or more to 1 mol or less".

Here, in general, the inorganic compound has numerous modification examples. Moreover, as mentioned above, the mineral having the crystal structure of the garnet also has numerous modification examples. Therefore, the rare earth aluminum garnet-type inorganic oxide according to this embodiment also incorporates numerous modification examples somewhat different from that in General formula (1) within the scope of not damaging the crystal structure of the garnet. This point is described by mentioning specific examples. That is to say, an elemental composition of the inorganic oxide according to this embodiment is, for example, $Ca_2EuX_2(AlO_4)_3$. At this time, it is interpreted that the inorganic oxide according to this embodiment is isomorphic to $Ca_2EuX_2(AlO_4)_3$, and includes a modification example in which that the above-described $Ca_2EuX_2(AlO_4)_3$ serves as an endmember of the solid solution. Note that the above-described "end member" is a term of the lithology, and refers to a component that forms a limit of the composition of the solid solution.

Then, as mentioned above, M in General formula (1) includes at least calcium (Ca). However, calcium is partially replaceable by an element that is other than calcium and can become divalent ions. Therefore, M in General formula (1) may include Ca and at least one element selected from the group consisting of alkaline earth metal, Fe(II), Mn, Zn, Cd, Co and Cu. Moreover, as the alkaline earth metal, Mg, Sr and Ba are particularly preferable. Note that, in the case of using the inorganic oxide of this embodiment as the phosphor, it is particularly preferable that M in General formula (1) include Ca and at least one element selected from the group consisting of the alkaline earth metal, Mn and Zn.

In the inorganic oxide of this embodiment, it is preferable that calcium (Ca) occupy a large majority of M in General formula (1). Here, "Ca occupies a large majority of M" means that Ca atoms occupy a large majority of an atom group that occupies M. If the composition as described above is employed, then the inorganic oxide of this embodiment can function as a mother material of the higher-efficiency phosphor or as the higher-efficiency phosphor itself. Note that M may be occupied by only calcium.

Moreover, as mentioned above, Ln in General formula (1) includes at least europium (Eu). However, europium is partially replaceable by an element that is other than europium and can become trivalent ions, and particularly, by a rare earth element. As the element that can become the trivalent ions, there are mentioned Sc, Y, La, Ce, Pr, Nd, Sm, Tb, Gd, Dy, Ho, Er, Tm, Yb, Lu, In, Sb, Bi and the like. Preferably, the element is at least one selected from Sc, Y, La, Ce, Pr, Nd, Sm, Tb, Gd, Dy, Ho, Er, Tm, Yb, Lu and the like. Therefore, Ln in General formula (1) may include Eu and at least one element selected from the group consisting of Sc, Y, La, Ce, Pr, Nd, Sm, Tb, Gd, Dy, Ho, Er, Tm, Yb, Lu, In, Sb and Bi. Note that, in the case of using the inorganic oxide of this embodiment as the phosphor, it is particularly preferable that Ln in General formula (1) include Eu and at least one element selected from the group consisting of Y, La, Ce, Pr, Sm, Tb, Gd, Lu and In.

In the inorganic oxide of this embodiment, in order to compose the phosphor in which the feature is conspicuous in terms of composition, it is preferable that europium (Eu) occupy a large majority of Ln in General formula (1). Here, "Eu occupies a large majority of Ln" means that Eu atoms occupy a large majority of an atom group that occupies Ln. If the composition as described above is employed, then Eu itself becomes the light emission center, and accordingly, the inorganic oxide of this embodiment can function as a mother material of the higher-efficiency phosphor or as the higher-efficiency phosphor itself. Note that Ln may be occupied by only europium.

In the inorganic oxide of this embodiment, in order to compose the phosphor in which the feature is conspicuous in terms of composition, it is preferable that Ln in General formula (1) contain Eu and at least one element selected from the group consisting of Y, Tb and Gd.

Moreover, in the inorganic oxide of this embodiment, it is also preferable that Ln in General formula (1) contain at least Eu, and that the large majority of Ln be occupied by at least one element selected from the group consisting of yttrium (Y), gadolinium (Gd) and terbium (Tb). Here, "the large majority of Ln is occupied by at least one element selected from the group consisting of Y, Gd and Tb" means that the majority of the atom group that occupies Ln is occupied by at least one type of atoms, which is selected from the group consisting of Y atoms, Gd atoms and Tb atoms. In a case where the inorganic oxide has such a composition, the phosphor that emits red light with a good color tone can be obtained, in particular, by setting the number of Eu atoms in General formula (1) at a low concentration that exceeds 0 and is less than 0.1. In other words, even if the number of Eu moles in 1 mol of the inorganic oxide represented by General formula (1) is set to exceed 0 mol and to be less than 0.1 mol, the phosphor that emits red light with a good color tone can be obtained.

Furthermore, as mentioned above, X in General formula (1) includes at least either one of zirconium (Zr) and hafnium (Hf). Zirconium and hafnium are partially replaceable by an element that is other than these elements and can become tetravalent ions. As the element that can become the tetravalent ions, Si, Ge, Ti, Sn, Pb and the like are mentioned, and Sn is preferable. Therefore, X in General formula (1) may include at least either one of Zr and Hf, and at least one element selected from the group consisting of Si, Ge, Ti, Sn and Pb. Note that, in the case of using the inorganic oxide of this embodiment as the phosphor, it is particularly preferable that X in General formula (1) include at least either one of Zr and Hf and at least one element selected from the group consisting of Si, Ge, Ti and Sn.

Moreover, in the inorganic oxide, it is preferable that zirconium (Zr) and/or hafnium (Hf) occupy a large majority of X in General formula (1). Here, "Zr and/or Hf occupies a large majority of the element X" means that Zr atoms and/or Hf atoms occupy a large majority of an atom group that occupies X. If the composition as described above is employed, then the inorganic oxide of this embodiment can function as the mother material of the higher-efficiency phosphor or as the higher-efficiency phosphor itself. Note that X may be occupied by only Zr and/or Hf.

As such a compound, which is preferable as a fluorescent substance and isomorphic to the inorganic oxide of this embodiment, there are exemplified $Ca_2(Eu,Ce)Zr_2(AlO_4)_3$, $Ca_2(Y,Eu)Zr_2(AlO_4)_3$, $Ca_2(Eu,Tb)Zr_2(AlO_4)_3$ and the like. Moreover, $Ca_2(La,Eu)Hf_2(AlO_4)_3$, $(Ca,Sr)_2(Y,E)(Zr,Hf)_2(AlO_4)_3$, $(Ca,Mg)_2EuZr_2(AlO_4)_3$, $Ca_2(Eu,Pr)Zr_2(AlO_4)_3$ and the like. Furthermore, $Ca_2(Eu,Tb,Ce)Zr_2(AlO_4)_3$ and the like are also exemplified.

The inorganic oxide of this embodiment may form a solid solution, which is solid-solved with a compound, and is different in composition from the inorganic oxide. Then, it is preferable that this solid solution have the garnet structure in a similar way to the inorganic oxide of this embodiment. The solid solution as described above can also become the rare earth aluminum garnet-type phosphor having the novel fluorescent characteristics.

Note that, in order to cause Eu, which is contained in the solid solution, to function as the light emission center as mentioned above, at least Eu just needs to be contained therein. Note that, in order to obtain such red light that is relatively good in terms of color purity, it is sufficient if the number of Eu moles in 1 mol of the above-described solid solution is set, for example, within a range exceeding 0 mol to less than 0.1 mol, or a range of 0.1 mol or more to less than 3 moles.

Here, as the compound solid-solved in the inorganic oxide of this embodiment, a compound having the garnet structure is preferable, and particularly, a compound isomorphic to the above-described inorganic oxide is more preferable. In such a way, properties inherent in the above-described compound become similar to those of the inorganic oxide, and accordingly, it becomes possible to easily form the solid solution of this embodiment, which has the crystal structure of the garnet. Examples of the compound that are solid-solved in the inorganic oxide of this embodiment and form the solid solution will be described later.

Incidentally, as mentioned above, it is known that the natural garnet is usually present as the solid solution of the plural types of garnets which become the end members. Meanwhile, for example, $Ca_2EuZr_2(AlO_4)_3$, $Ca_2EuHf_2(AlO_4)_3$ and the like in the inorganic oxide of this embodiment can be regarded as the end members. Therefore, in accordance with the solid solution of the inorganic oxide of this embodiment and of the compound that has such a different garnet structure from that of the inorganic oxide and can become the end member, it is possible to obtain numerous types of the solid solutions, each of which has the crystal structure of the garnet.

Then, when the solid solution of this embodiment has the garnet structure as mentioned above, it is preferable that the solid solution have a composition represented by General formula (2).

$$A_3D_2(EG_4)_3 \qquad (2)$$

Here, $(EG_4)$ in General formula (2) has a tetrahedral structure. E includes Al and at least one element selected from Zn, Al, Si, Ge and P. G includes O.

Such a tetrahedron $(EG_4)$ in General formula (2) corresponds to the $(AlO_4)$ tetrahedron in the inorganic oxide represented by General formula (1). This tetrahedron $(EG_4)$ is partially replaceable by tetrahedrons other than the $(AlO_4)$ tetrahedron. As the tetrahedrons other than the above-described $(AlO_4)$ tetrahedron, tetrahedrons such as $(SiO_4)$, $(GeO_4)$, $(SiO_3N)$, $(ZnO_4)$, $(FeO_4)$, $(VO_4)$ and $(PO_4)$ are mentioned. Note that, in a case where the valence of the tetrahedron is deviated from the valence of the $(AlO_4)$ tetrahedron, that is, the negative pentavalent value in response to a form of the solid solution, then the solid solution is composed while being attended with charge compensation provided by any of Ca, Eu and the element X.

The element corresponding to A in General formula (2) is Ca and Eu. Moreover, at least either one of Ca and Eu in the element A is partially replaceable by an element that can become divalent or trivalent ions. Furthermore, at least either one of Ca and Eu in the element A is replaceable by an element other than the element that can become the divalent or trivalent ions. As the element that can partially replace Ca and Eu, an element is preferable, which can become monovalent to trivalent ions while being attended with charge compensation provided by at least either one of the element X in General formula (1) and the tetrahedron other than the $(AlO_4)$ tetrahedron. In addition, an element is preferable, in which an ion radius is 0.6 Å or more to less than 1.7 Å, and particularly, 0.8 Å or more to less than 1.4 Å.

As such an element that can partially replace Ca and Eu, in which the ion radius is 0.6 Å or more to less than 1.7 Å, there can be mentioned: alkali metal such as Li, Na, K, Rb and Cs; and alkali earth metal such as Mg, Ca, Sr and Ba. Moreover, as such an element, there can also be mentioned: rare earth elements such as Sc, Y, La, Ce, Pr, Nd, Sm, Tb, Gd, Tb, Dy, Ho, Er, Tm, Yb and Lu; and transition metal elements such as Mn, Fe, Co, Cu and Zn. Note that, in this description, the "ion radius" means an ion radius of Ahrens.

D in General formula (2) includes the element represented by X in General formula (1) and at least one element selected from Mg, Sc, Y, Ti, V, Zr, Hf, Zn, Al, Ga, In, Ge and Sn. D in General formula (2) is an element corresponding to the element X in General formula (1). As mentioned above, the element X in General formula (1) includes at least either one of Zr and Hf. Note that the element D in General formula (2) can be partially replaced by the element that can become the tetravalent ions. Moreover, the element D can also be replaced by the element other than the element that can become the tetravalent ions. As the element that can partially replace the element D, an element is preferable, which can become divalent or trivalent ions while being attended with charge compensation provided by at least any one of Ca, Tb and the tetrahedron other than the ($AlO_4$) tetrahedron. In addition, moreover, as the element that can partially replace the element D, an element is preferable, in which an ion radius is 0.4 Å or more to less than 0.95 Å, and particularly, 0.5 Å or more to less than 0.8 Å.

As such an element in which the ion radius is 0.4 Å or more to less than 0.95 Å, there are mentioned: the rare earth elements such as Mg, Sc and Y; and transition metal and typical element metal, such as Ti, V, Cr, Mn, Fe, Co, Ni, Cu, Zn, Al, Ga, and In.

Note that, in the solid solution represented by General formula (2), it is preferable that an index of the partial replacement of A, D and ($EG_4$) be a half or less with respect to one piece of such a replacement target element, and moreover, be a half or less with respect to one piece of the ($AlO_4$) tetrahedron in the ($AlO_4$) tetrahedron. In other words, it is preferable that, in the solid solution, Ca and Eu occupy a large majority of A in General formula (2). Moreover, it is preferable that, in the solid solution, the element X occupy a large majority of D in General formula (2). Furthermore, it is preferable that, in the solid solution, ($AlO_4$) occupy a large majority of ($EG_4$) in General formula (2).

As described above, the inorganic oxide according to this embodiment is capable of forming the solid solution with the compound isomorphic to the inorganic oxide. Then, as mentioned above, in order to make the solid solution characteristic in terms of the composition, it is preferable that the number of Eu moles in 1 mol of the solid solution be 0.1 mol or more to less than 3 moles. Note that, even if the number of Eu moles in 1 mol of the solid solution exceeds 0 mol and is less than 0.1 mol, the color purity of the red light can be enhanced in comparison with the conventional product.

As specific examples of the compound that forms the solid solution with the inorganic oxide according to this embodiment, there can be mentioned $Y_3Al_2(AlO_4)_3$, $Tb_3Al_2(AlO_4)_3$, $Y_3Ga_2(AlO_4)_3$, $Ca_2YZr_2(AlO_4)_3$ and $Ca_2YHf_2(AlO_4)_3$. Moreover, as the above-described compound, $Ca_2LaZr_2(AlO_4)_3$, $Ca_2LuZr_2(AlO_4)_3$, $Ca_2LuHf_2(AlO_4)_3$, $Ca_2YSn_2(AlO_4)_3$, $Ca_2LaSn_2(AlO_4)_3$, $Ca_2TbZr_2(AlO_4)_3$ and the like can also be mentioned. Note that the compound that forms the solid solution is not limited to these.

The solid solution of this embodiment may contain at least one element, which is selected from H, B, C, S, F, Cl and the like, as well as the above-mentioned elements. Moreover, the solid solution of this embodiment may contain nitrogen. That is to say, the element G in the tetrahedron ($EG_4$) in General formula (2) may contain nitrogen as well as oxygen, and the solid solution may be an oxynitride.

Shapes of the rare earth aluminum garnet-type inorganic oxide and solid solution of this embodiment are not particularly limited. That is to say, in a similar way to the conventional YAG and the like, the rare earth aluminum garnet-type inorganic oxide and the solid solution are formable into compounds with a variety of shapes including a crystalline state of a single crystal or a polycrystal (ceramics), or a thin film shape, a thick film shape, a block shape, a granular shape, a powder shape, a nano-particle shape, and the like. Moreover, in a similar way to the natural garnet, the rare earth aluminum garnet-type inorganic oxide and solid solution of this embodiment are usable, for diverse purposes, as new industrial materials such as man-made jewel, abrasive, a ceramic material and an electron material.

It is possible to produce the rare earth aluminum garnet-type inorganic oxide of this embodiment by a method known in public. Specifically, in a similar way to YAG, the rare earth aluminum garnet-type inorganic oxide can be synthesized by using a solid phase reaction known in public.

First, a rare earth oxide ($Sc_2O_3$, $Y_2O_3$, $La_2O_3$, $CeO_2$, $Pr_6O_{11}$, $Eu_2O_3$, $Gd_2O_3$, $Tb_4O_7$, $Lu_2O_3$), which is universal ceramic raw powder, or the like is prepared. Moreover, alkaline earth carbonate ($CaCO_3$), $Al_2O_3$, $Ga_2O_3$, $ZrO_2$, $HfO_2$ or the like is prepared. Next, such types of raw material powder are blended with each other so as to obtain a stoichiometric composition of a desired inorganic oxide or a composition approximate thereto, and are sufficiently mixed with each other by using a mortar, a ball mill or the like. Thereafter, the mixed raw materials are fired by an electric furnace or the like by using a firing container such as an alumina melting pot, whereby the inorganic oxide of this embodiment can be prepared. Note that, in an event of firing the mixed raw materials, it is preferable to heat the mixed raw materials at a firing temperature of 1500 to 1700° C. for a few hours under the atmosphere or a weakly reductive atmosphere.

[Rare Earth Aluminum Garnet-Type Phosphor]

Next, a description is made of the rare earth aluminum garnet-type phosphor according to the embodiment of the present invention.

The phosphor according to this embodiment contains an inorganic oxide having the composition represented by General formula (1), in which a crystal structure is the garnet structure. Then, $Eu^{3+}$ contained in the above-described inorganic oxide emits a plurality of bright line-like fluorescent components. The fluorescent components are emitted when an external stimulus to be described later is given to $Eu^{3+}$ in the inorganic oxide. Moreover, a principal bright line of the above-described fluorescent components is present within a wavelength range of 600 nm or more to less than 628 nm. Then, a maximum height of a bright line present within a wavelength range of 700 nm or more to less than 720 nm is less than 60%, preferably, less than 40% of a maximum height of the above-described principal bright line.

Then, it is preferable that the phosphor be composed by using the rare earth aluminum garnet-type inorganic oxide (including the above-described solid solution) as a main skeleton of the crystal. That is to say, in the above-mentioned inorganic oxide, as will be described later, the inorganic oxide itself has a function to emit the fluorescence, and accordingly, the phosphor of this embodiment uses the properties of the inorganic oxide exclusively. In other words, the phosphor of this embodiment is a compound, which is mainly composed of the above-described inorganic oxide, and emits the fluorescence.

In general, the phosphor refers to a compound in which a part of the elements composing the crystal of the compound is partially replaced by the element that can become the ions having characteristics to emit the fluorescence. The ions having such characteristics as described above are usually referred to as the "light emission center". Then, as mentioned above, the inorganic oxide of this embodiment includes at least calcium (Ca), europium (Eu), zirconium (Zr) and/or hafnium (Hf), aluminum (Al) and oxygen (O) as the constituent elements of the crystal. Eu is an element capable of forming $Eu^{3+}$ known as the light emission center that emits the red light. Moreover, $Eu^{3+}$ is an ion, which is less likely to be quenched although a concentration thereof is increased, and is known as a light emission center with less concentration quenching. Therefore, the rare earth aluminum garnet-type inorganic oxide (including the above-described solid solution) of this embodiment has a function to emit the fluorescence from the inorganic oxide itself. That is to say, the phosphor of this embodiment has such characteristics that at least $Eu^{3+}$ can become the light emission center and that $Eu^{3+}$ can emit the fluorescent component.

Incidentally, as a red phosphor with activated $Eu^{3+}$, which has been heretofore widely used for a light-emitting device, $Y_2O_3:Eu^{3+}$, $Y_2O_2S:Eu^{3+}$, $YVO_4:Eu^{3+}$, $Y(P,V)O_4:Eu^{3+}$, $(Y,Gd)BO_3:Eu^{3+}$ and the like are present. Moreover, besides the above, $Y_2SiO_5:Eu^{3+}$, $Y_3Al_2(AlO_4)_3:Eu^{3+}$ and the like are known. Among these red phosphors, particularly, $Y_2O_3:Eu^{3+}$, $Y_2O_2S:Eu^{3+}$, $YVO_4:Eu^{3+}$, $Y(P,V)O_4:Eu^{3+}$ are red phosphors which emit the red light that is good in terms of the color purity. Then, in a case where $Eu^{3+}$ in the phosphor of this embodiment functions as the light emission center, it becomes possible to realize a red phosphor having a light emission spectrum equivalent to that of the conventional $Y_2O_2S:Eu^{3+}$ red phosphor, $Y(P,V)O_4:Eu^{3+}$ red phosphor or the like.

As described above, the inorganic oxide of this embodiment has a function to emit intense fluorescence by itself. However, it is preferable to modify the inorganic oxide of this embodiment as follows from a viewpoint of obtaining a higher-efficiency phosphor.

First, a description is made of elements which are preferably not contained in the inorganic oxide of this embodiment. For example, transition metal such as Fe, Co, Ni, V, Cu, Cr and Ti is known as an element that forms an ion causing a decrease of light emission intensity of the phosphor. Then, such an ion decreases the light emission intensity of the phosphor, and accordingly, is usually called a killer center. Therefore, it is preferable that the phosphor of this embodiment should not contain these transition metals.

Next, a description is made of elements or ions which are preferably contained in the inorganic oxide of this embodiment. It is more preferable that the phosphor of this embodiment allow the above-described inorganic oxide or solid solution to contain a large amount of the ion that becomes the light emission center. That is to say, the inorganic oxide of this embodiment and the solid solution containing the same include at least Eu that forms $Eu^{3+}$ as the light emission center. However, in order to allow the phosphor of this embodiment to emit light more efficiently, it is also preferable to add another light emission center in addition to $Eu^{3+}$. Note that, even in a case of not radiating the fluorescence generated by $Eu^{3+}$, the inorganic oxide, the solid solution and the phosphor, which satisfy the composition of the present invention, are incorporated in the technical scope of the present invention if such a light emission center ion other than $Eu^{3+}$ emits the fluorescence.

As the light emission center other than $Eu^{3+}$, there is used an ion or the like, the ion being capable of emitting the fluorescence by electron energy transition in the crystal of the compound that functions as the mother material of the phosphor, that is, the above-described inorganic oxide and solid solution. Specifically, it is preferable to use, as the light emission center, at least one of: $Sn^{2+}$, $Sb^{3+}$, $Tl^+$, $Pb^{2+}$ and $Bi^{3+}$, each of which is called an $ns^2$-type ion light emission center; and $Cr^{3+}$, $Mn^{4+}$, $Mn^{2+}$ and $Fe^{3+}$, each of which is called a transition metal ion light emission center. Moreover, it is also preferable to use, as the light emission center, at least one of $Ce^{3+}$, $Pr^{3+}$, $Nd^{3+}$, $Sm^{3+}$, $Tb^{3+}$, $Gd^{3+}$, $Dy^{3+}$, $Ho^{3+}$, $Er^{3+}$, $Tm^{3+}$, $Yb^{3+}$, $Sm^{2+}$, $Eu^{2+}$ and $Yb^{2+}$, each of which is called a rare earth ion light emission center.

Note that it is more preferable that the light emission center in the phosphor of this embodiment be $Eu^{3+}$ and at least one ion selected from $Mn^{4+}$, $Mn^{2+}$, $Ce^{3+}$, $Pr^{3+}$ and $Tb^{3+}$. In this case, it becomes possible to obtain a phosphor that emits multi-purpose visible light components, that is, blue, blue green, green, yellow, orange, red and white. Moreover, it is particularly preferable that the light emission center in the phosphor of this embodiment be $Eu^{3+}$ and at least one ion selected from $Mn^{2+}$, $Ce^{3+}$, $Pr^{3+}$ and $Tb^{3+}$. In this case, it becomes possible to obtain a phosphor that emits blue green light, green light, orange light, red light or white light, which are more frequently used in a display device and a lighting device.

As mentioned above, it is preferable that the phosphor of this embodiment contains not only $Eu^{3+}$ but also, as a coactivator, the other light emission center than $Eu^{3+}$, and particularly, at least one ion selected from $Ce^{3+}$, $Pr^{3+}$, $Tb^{3+}$ and $Mn^{2+}$. For example, $Ce^{3+}$ does not only function as the light emission center but also has a function to absorb the short-wavelength visible light in a case of being present in crystal lattices of the above-described inorganic oxide and solid solution. Therefore, it is also preferable that the phosphor of this embodiment is allowed to not only contain $Eu^{3+}$ but also further contain $Ce^{3+}$. In such a way, $Ce^{3+}$ absorbs the short-wavelength visible light, and accordingly, it becomes possible to obtain a phosphor that absorbs the short-wavelength visible light.

Moreover, $Ce^{3+}$ also functions as a sensitizer, and can increase light emission intensity of $Pr^{3+}$ having a bright line-like red component. Therefore, it is also preferable that the phosphor of this embodiment contains not only $Eu^{3+}$ and $Ce^{3+}$ but also $Pr^{3+}$. In such a way, it becomes possible to obtain a phosphor that emits not only the light emission component of $Eu^{3+}$ but also a light emission component of $Pr^{3+}$. That is to say, it becomes possible to obtain a phosphor that combines properties to absorb the short-wavelength visible light and properties to emit the bright-line like red light generated by $Eu^{3+}$ and the bright-line like red light generated by $Pr^{3+}$.

Furthermore, $Ce^{3+}$ also functions as a sensitizer of $Mn^{2+}$, and can increase light emission intensity of $Mn^{2+}$ having an orange component with a wide spectrum width. Therefore, it is also preferable that the phosphor of this embodiment contain not only $Eu^{3+}$ and $Ce^{3+}$ but also $Mn^{2+}$. In such a way, it becomes possible to obtain a phosphor that emits not only the light emission component of $Eu^{3+}$ but also a light emission component of $Mn^{3+}$.

Moreover, it is also preferable that the phosphor of this embodiment is allowed to also contain $Tb^{3+}$ as the other light emission center than $Eu^{3+}$. In such a way, a phosphor, which emits a light component that combines a red bright line emitted by $Eu^{3+}$ and a green bright line emitted by $Tb^{3+}$ with each other, can be obtained. In a case where the phosphor of this embodiment contains not only $Tb^{3+}$ but also $Ce^{3+}$, then light energy absorbed by $Ce^{3+}$ is moved to $Tb^{3+}$ efficiently, and accordingly, a phosphor, which can perform wavelength conversion for the short-wavelength visible light, into at least the green bright line, can be obtained. Moreover, this phosphor becomes a phosphor in which the light energy moved to $Tb^{3+}$ is moved to $Eu^{3+}$.

As described above, in the rare earth aluminum garnet-type phosphor of this embodiment, it is preferable that the above-mentioned light emission center be contained in the above-described inorganic oxide or solid solution, which contains Eu. In such a way, the above-described inorganic oxide and solid solution are easily excited by an external stimulus, for example, irradiation of a corpuscular ray (α-ray, β-ray, electron beam) and an electromagnetic wave (γ-ray, X-ray, vacuum ultraviolet ray, ultraviolet ray, visible light ray) and the like, and become capable of emitting the fluorescence. Note that, if the fluorescence emitted from the phosphor of this embodiment is any electromagnetic wave selected from the ultraviolet ray, the visible light ray and the ultraviolet ray, then the fluorescence can be used for a light-emitting device to be described later; however, preferable fluorescence for practical use is the visible light. If the emitted fluorescence is the visible light, then the fluorescence can be widely used, for example, for the light-emitting device for the display device and the lighting device.

As mentioned above, it is preferable that the rare earth aluminum garnet-type phosphor of this embodiment have not only $Eu^{3+}$ but also the other light emission center than $Eu^{3+}$. Specifically, it is preferable that the rare earth aluminum garnet-type phosphor in this embodiment contains, in the crystalline lattices, Ce, Pr, Tb and Mn as the rare earth element other than Eu. In such a way, a phosphor can be obtained, the phosphor emitting light, in which at least one light emission component of $Ce^{3+}$, $Pr^{3+}$, $Tb^{3+}$ and $Mn^{2+}$ is added to the light-emitting element of $Eu^{3+}$, in a case of being excited. As a result, the phosphor of this embodiment becomes capable of arbitrarily controlling a color tone of the luminescent color. Note that, because of similarity in ion radius, it is also preferable that La and Gd be contained as the other rare earth element than Eu in the crystalline lattices. In such a way, a phosphor, which emits the red light with good color purity, the red light being generated by $Eu^{3+}$, is obtained.

As mentioned above, the number of Eu moles per 1 mol of the inorganic oxide that becomes the phosphor is, for example, within the range exceeding 0 mol to less than 0.1 mol, or the range of 0.1 mol or more to less than 1 mol. Moreover, it is preferable that the number of moles of the element contained as the coactivator in the phosphor be 0.01 mol or more to less than 0.3 mol per 1 mol of the inorganic oxide.

In the phosphor of this embodiment, it is preferable that the light emission spectrum of the emitted light have the maximum value within the range of 600 nm or more to less than 628 nm, and particularly, the range from 605 nm or more to less than 620 nm. Apparent brightness of the light depends on visual sensitivity, and visual sensitivity of a human eye has a maximum value at 555 nm. Then, even if the energy intensity of the light is the same, the red light within the above-described range looks relatively bright, and accordingly, a phosphor with higher visibility can be obtained by providing the maximum value within this range.

The light emission component of $Eu^{3+}$, which is emitted from the phosphor of this embodiment, is composed of the plurality of bright lines. Representative bright lines among the fluorescent components are three, which are: the red bright line located within the above-described wavelength range of 600 nm or more to less than 628 nm; an orange bright line located within a wavelength range of 580 nm or more to less than 595 nm; and a near-infrared bright line located within a wavelength range of 700 nm or more to less than 720 nm. Note that, in a case where anions on the peripheries of $Eu^{3+}$ in the phosphor are arranged so as not to be symmetrical to $Eu^{3+}$, intensities of the above-described orange bright line and the above-described near-infrared bright line become relatively small with respect to intensity of the above-described red bright line. Therefore, in this case, the color purity of the red light emitted by $Eu^{3+}$ in the phosphor is improved. Hence, it is preferable that the phosphor of this embodiment contain an inorganic oxide in which the anions on the peripheries of $Eu^{3+}$ are arranged so as not to be symmetrical to $Eu^{3+}$.

Moreover, in the phosphor of this embodiment, it is preferable that a half width (FWHM) of the light emission spectrum within the range of 600 nm or more to less than 628 nm is 1 nm or more to less than 10 nm. In particular, it is preferable that a ⅕ spectrum width of the light emission spectrum in the range of 600 nm or more to less than 628 nm be 1 nm or more to less than 10 nm, and it is particularly preferable that a 1/10 spectrum width thereof be 1 nm or more to less than 10 nm. In the phosphor, it is most preferable that a ⅕ spectrum width or 1/10 spectrum width of the light emission spectrum in the range of 600 nm or more to less than 628 nm be 3 nm or more to less than 10 nm. In other words, it is preferable that the phosphor of this embodiment have the principal bright line of the fluorescent components within the wavelength range of 600 nm or more to less than 628 nm, and that the half width of the light emission spectrum composed of the principal bright line be 1 nm or more to less than 10 nm. In particular, it is more preferable that the ⅕ spectrum width of the light emission spectrum composed of the principal bright line be 1 nm or more to less than 10 nm, and it is particularly preferable that the 1/10 spectrum width be 1 nm or more to less than 10 nm. Moreover, it is most preferable that the ⅕ spectrum width or 1/10 spectrum width of the light emission spectrum composed of the principal bright line be 3 nm or more to less than 10 nm. The light emission spectrum as described above has such a bright line-like red light component, in which the light components are concentrated on the wavelength range with high visual sensitivity in the wavelength range of the red. Therefore, the phosphor as described above becomes capable of emitting a light component in which color purity of the red is good and the brightness is conspicuous. Note that the ⅕ spectrum width and the 1/10 spectrum width refer to widths of the above-described light emission spectrum at positions where the intensity of the light emission spectrum becomes ⅕ and 1/10 of the maximum value of the intensity when the maximum value is taken as 1.

Moreover, the light emission spectrum of the phosphor of this embodiment has characteristics that maximum intensity of a sub-bright line located within the wavelength range of 700 nm or more to less than 720 nm is smaller than 60% of the maximum intensity of the principal bright line, and particularly, is smaller than 40% thereof.

Note that the phosphor of this embodiment can be appropriately mixed with a solvent such as water, an organic solvent and resin, liquid glass, and the like, and can be used in a form of slurry, paste, sol and gel.

As mentioned above, the conventional $Eu^{3+}$-activated phosphor having the garnet structure does not emit the red light with a good color tone. However, the phosphor of this embodiment has such heretofore-not-possible characteristics that the $Eu^{3+}$ ions contained in the crystal lattices of the garnet structure emit the red fluorescence with good color purity.

[Light-Emitting Device]

Next, a description is made of the light-emitting device according to the embodiment of the present invention. The light-emitting device of this embodiment is characterized by including the above-described rare earth aluminum garnet-type phosphor. As mentioned above, the phosphor of this embodiment emits the red light with good color purity and narrow band characteristics. Therefore, the light-emitting device of this embodiment becomes capable of outputting red light, which has a narrowband light emission spectrum component, by combining the above-described phosphor and an excitation source that excites the phosphor with each other.

Note that the light-emitting device of this embodiment broadly embraces electronic devices including a function to emit light, and is not particularly limited as long as the electronic devices emit some light. That is to say, the light-emitting device of this embodiment is a light-emitting device, which uses at least the phosphor of this embodiment, and further uses the fluorescence emitted by the phosphor at least as output light.

More specifically, the light-emitting device of this embodiment combines the above-described phosphor and the excitation source that excites the phosphor with each other. Then, the above-described phosphor absorbs energy emitted by the excitation source, and converts the absorbed energy into the narrowband red light. Note that the excitation source just needs to be appropriately selected from a discharge device, an electron gun, a solid-state light emitting element and the like in accordance with excitation characteristics of the phosphor.

Moreover, it is preferable that the light emission spectrum of the phosphor include the spectrum component derived from the electron energy transition of $Eu^{3+}$. Furthermore, in the light emission spectrum of the above-described phosphor, preferably, the half width of the spectrum component within the range of 600 nm or more to less than 628 nm, preferably the ⅕ spectrum width thereof, more preferably the 1/10 spectrum width thereof is 1 nm or more to less than 10 nm. Then, it is preferable that the maximum intensity of the light emission spectrum component within the range of 700 nm or more to less than 720 nm be smaller than 60%, and particularly, 40% of the maximum intensity of the spectrum component within the range of 600 nm or more to less than 628 nm. Note that the energy transition of $Eu^{3+}$ refers to the $^5D_j \rightarrow {}^7F_j$ transition by the $4f^6$ electron of $Eu^{3+}$.

Heretofore, there have been numerous light-emitting devices using the phosphor, and for example, a fluorescent lamp, an electron tube, a plasma display panel (PDP), a white LED, and further, a detector using the phosphor apply to the light-emitting devices. In a broad sense, an illumination light source, an illumination device, a display device or the like, which uses the phosphor, is also the light-emitting device, and a projector provided with a laser diode, a liquid crystal display provided with an LED backlight, or the like is also regarded as the light-emitting device. Here, the light-emitting device of this embodiment can be classified depending on types of the fluorescence emitted by the phosphor, and accordingly, such classification is described.

The fluorescence phenomenon for use in the electronic devices is academically classified into some categories, and is distinguished by terms such as photoluminescence, cathodeluminescence, and electroluminescence. The photoluminescence refers to fluorescence emitted by the phosphor when the phosphor is irradiated with an electromagnetic wave. Note that the term "electromagnetic wave" generically refers to the X-ray, the ultraviolet ray, the visible light, the infrared ray and the like. The cathodeluminescence refers to fluorescence emitted by the phosphor when the phosphor is irradiated with an electron beam. Moreover, the electroluminescence refers to fluorescence emitted by the phosphor when electrons are injected into the phosphor or an electric field is applied thereto. As fluorescence similar to the photoluminescence in principle, there is a term "thermoluminescence", which refers to fluorescence emitted by the phosphor when the phosphor is heated. Moreover, as fluorescence similar to the cathodeluminescence in principle, there is also a term "radioluminescence", which refers to fluorescence emitted by the phosphor when the phosphor is irradiated with a radiation.

As previously mentioned, the light-emitting device of this embodiment uses the fluorescence, which is emitted by the above-mentioned rare earth aluminum garnet-type phosphor, at least as the output light. Then, the fluorescence mentioned herein can be classified at least as mentioned above, and accordingly, the fluorescence can be replaced by at least one fluorescence phenomenon selected from the above-described pieces of luminescence.

Note that, as typical examples of the light-emitting device that uses the photoluminescence of the phosphor as the output light, there are mentioned an X-ray image intensifier, a fluorescent lamp, a white LED, a semiconductor laser projector using the phosphor and a laser diode, and a PDP. Moreover, as typical examples of the light-emitting device that uses the cathodeluminescence as the output light, an electron tube, a fluorescent character display tube and a field emission display (FED) are mentioned. Furthermore, as typical examples of the light-emitting device that uses the electroluminescence as the output light, there are mentioned an inorganic electroluminescence display (inorganic EL), a light-emitting diode (LED), a semiconductor laser (LD) and an organic electroluminescence device (OLED). Then, as the light-emitting device that uses the electroluminescence from the phosphor of this embodiment, for example, an inorganic electroluminescence display can be mentioned.

A description is made below of the light-emitting device of this embodiment with reference to the drawings. FIGS. 1A and 1B show an outline of the light-emitting device according to this embodiment. In FIG. 1A and FIG. 1B, an excitation source 1 is a light source that generates primary light for exciting a phosphor 2 of this embodiment. As the excitation source 1, a radiation device can be used, which emits the corpuscular ray such as the α-ray, the β-ray and the electron beam and the electromagnetic wave such as the γ-ray, the X-ray, the vacuum ultraviolet ray, the ultraviolet ray and the visible light (particularly, the short-wavelength visible light such as the purple light and the blue light). Moreover, as the excitation source 1, there can be used a generation device of a variety of radiations, an electron beam radiation device, a discharge light generation device, a solid-state light-emitting element, the solid-state light-emitting device and the like. As representatives of the excitation source 1, there are mentioned an electron gun, an X-ray tube, a rare gas discharge device, a mercury discharge device, a light-emitting diode, a laser light generation device including a semiconductor laser, an inorganic or organic electroluminescence element and the like.

Moreover, as shown in FIG. 1A and FIG. 1B, output light 4 is an excitation line emitted by the excitation source 1 or fluorescence emitted by the phosphor 2 excited by excitation light 3. Then, the output light 4 is used as illumination light or display light in the light-emitting device.

FIG. 1A shows a light-emitting device with a structure in which the output light 4 from the phosphor 2 is emitted in a direction of irradiating the excitation line or the excitation light 3 onto the phosphor 2. Note that, as the light-emitting device shown in FIG. 1A, a white LED light source, a fluorescent lamp, an electron tube and the like are mentioned. Meanwhile, FIG. 1B shows a light-emitting device with a structure in which the output light 4 from the phosphor 2 is emitted in a direction reverse to the direction of irradiating the excitation line or the excitation light 3 onto the phosphor 2. As the light-emitting device shown in FIG.

1B, a plasma display device, a light source device using a phosphor wheel added with a reflecting plate, a projector and the like are mentioned.

Preferable specific examples of the light-emitting device of this embodiment are a semiconductor light-emitting device, an illumination light source, an illumination device, an LED backlight-added liquid crystal panel, an LED projector, a laser projector, and the like, each of which is composed by using the phosphor. Particularly preferable specific examples of the light-emitting device are the device with a structure in which the phosphor is excited by the short-wavelength visible light and the short-wavelength visible light is emitted by the solid-state light-emitting element.

Figure 2:
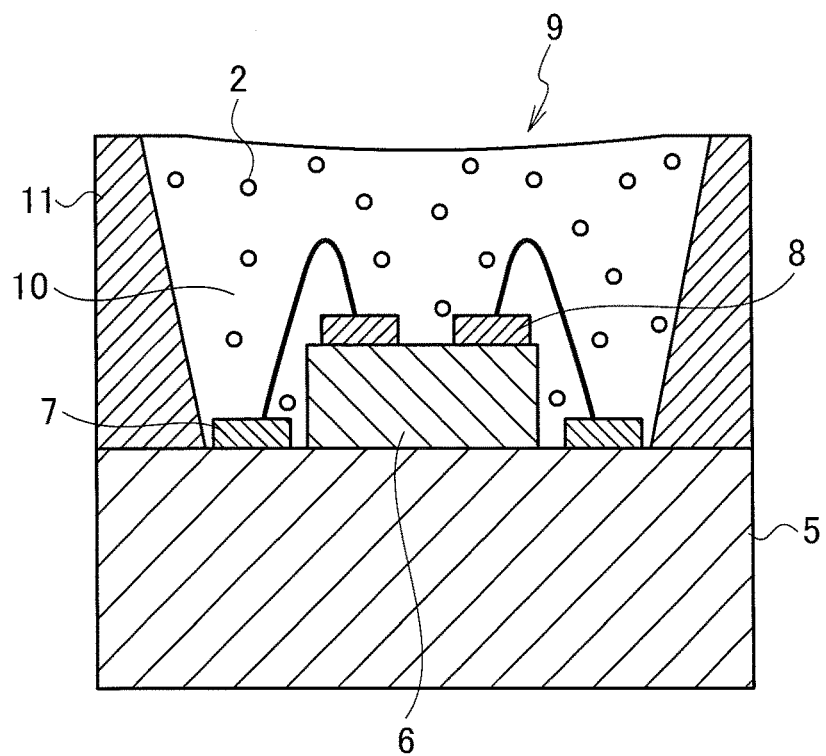
FIG. 2 is a cross-sectional view schematically showing an example of a semiconductor light-emitting device according to the embodiment of the present invention.

A description is made below in detail of a specific example of the semiconductor light-emitting device as the light-emitting device according to this embodiment. FIG. 2 is a cross-sectional view schematically showing the semiconductor light-emitting device as a specific example of the light-emitting device according to this embodiment. FIG. 2 is a cross-sectional view; however, hatching showing a cross section of translucent resin 10 is omitted in consideration of visibility of the drawing. The semiconductor light-emitting device shown in FIG. 2 includes: a substrate 5; a solid-state light-emitting element 6 arranged on the substrate 5; a sidewall 11 that surrounds the solid-state light-emitting element 6 on the substrate 5; and a wavelength conversion layer 9, which is formed in a space surrounded by a front surface of the substrate 5 and the sidewall 11, and emits fluorescence by an external stimulus and the like.

In FIG. 2, the substrate 5 serves as a base for fixing the solid-state light-emitting element 6. Then, the substrate 5 is composed of ceramics such as $Al_2O_3$ and AN, metal such as Al and Cu, glass, and resin such as silicon resin and filler-contained silicon resin.

Moreover, wiring conductors 7 are provided on the substrate 5, and power feed electrodes 8 of the solid-state light-emitting element 6 and the wiring conductors 7 are electrically connected to each other by using gold wires and the like, whereby power is fed to the solid-state light-emitting element 6.

The solid-state light-emitting element 6 as a light source that generates the primary light is an electro-optic conversion element that converts electric energy into light energy such as a near-ultraviolet ray, purple light and blue light by supply of power, which applies a voltage of at least any one selected from a direct current, an alternating current and a pulse. As the solid-state light-emitting element 6, there can be used an LED, an LD, an inorganic electroluminescence (EL) element, an organic EL element and the like. In particular, in order to obtain primary light with a high output and a narrow spectrum half width, the LED or the LD is preferable as the solid-state light-emitting element 6. Note that FIG. 2 shows a configuration in a case where an LED is employed, which uses an InGaN-based compound as a light-emitting layer.

The wavelength conversion layer 9 includes the phosphor 2 made of the fluorescent substance, and performs the wavelength conversion for the primary light, which is emitted by the solid-state light-emitting element 6, into light that has moved relatively to a long wavelength side. Moreover, as shown in FIG. 2, the wavelength conversion layer 9 is surrounded by the sidewall 11, and further, particles of the phosphor 2 according to this embodiment are dispersed into the translucent resin 10. Note that the wavelength conversion layer 9 in the semiconductor light-emitting device of this embodiment can also be composed by containing the phosphor in a resin fluorescent film, translucent fluorescent ceramics, fluorescent glass and the like.

For the wavelength conversion layer 9, the rare earth aluminum garnet-type phosphor according to this embodiment can be used solely as the phosphor 2; however, a phosphor different from the phosphor according to this embodiment may be contained according to needs. Moreover, plural types of the rare earth aluminum garnet-type phosphors, which are different from one another in either phase of the luminescent color and the composition, may be used in combination.

The phosphor, which can be used for the wavelength conversion layer 9 and is different from the phosphor of this embodiment, is not particularly limited as long as the phosphor absorbs the primary light emitted by the solid-state light-emitting element 6 and performs the wavelength conversion for the primary light into the light that has moved relatively to the long wavelength side. The phosphor can be appropriately selected from a variety of phosphors which emit the blue light, the green blue light, the blue green light, the green light, the yellow light, the orange light and the red light as the luminescent color, whereby the semiconductor light-emitting device is enabled to emit output light of a desired color.

As mentioned above, the $Eu^{3+}$-activated phosphor of this embodiment can be used as the phosphor for the semiconductor light-emitting device in the case where the LED or the LD is used as the solid-state light-emitting element 6. Note that, as the phosphor, there can be used not only the $Eu^{3+}$-activated phosphor of this embodiment but also, for example, an oxide-based phosphor such as an oxide or an acid halide, which is activated by at least any of $Eu^{2+}$, $Ce^{3+}$, $Tb^{3+}$ and $Mn^{2+}$. Moreover, as the phosphor, there can be used a nitride-based phosphor such as a nitride and an oxynitride, which are activated by at least any of $Eu^{2+}$, $Ce^{3+}$, $Tb^{3+}$, and $Mn^{2+}$ or a sulfide-based phosphor such as a sulfide and an oxysulfide, which are activated thereby.

Specifically, as a blue phosphor, there are used $BaMgAl_{10}O_{17}:Eu^{2+}$, $CaMgSi_2O_6:Eu^{2+}$, $Ba_3MgSi_2O_8:Eu^{2+}$, $Sr_{10}(PO_4)_6Cl_2:Eu^{2+}$ and the like. As a green blue or blue green phosphor, there are used $Sr_4Si_3O_8Cl_4:Eu^{2+}$, $Sr_4Al_{14}O_{24}:Eu^{2+}$, $BaAl_8O_{13}:Eu^{2+}$ and $Ba_2SiO_4:Eu^{2+}$. Moreover, as the green blue or blue green phosphor, there are used $BaZrSi_3O_9:Eu^{2+}$, $Ca_2YZr_2(AlO_4)_3:Ce^{3+}$, $Ca_2YHf_2(AlO_4)_3:Ce^{3+}$ and $Ca_2YZr_2(AlO_4)_3:Ce^{3+},Tb^{3+}$. As a green phosphor, there are used $(Ba,Sr)_2SiO_4:Eu^{2+}$, $Ca_8Mg(SiO_4)_4Cl_2:Eu^{2+}$ and $Ca_8Mg(SiO_4)_4Cl_2:Eu^{2+}$, $Mn^{2+}$. Moreover, as the green phosphor, there are used $BaMgAl_{10}O_{17}:Eu^{2+}$, $Mn^{2+}$, $CeMgAl_{11}O_{19}:Mn^{2+}$, $Y_3Al_2(AlO_4)_3:Ce^{3+}$ and $Lu_3Al_2(AlO_4)_3:Ce^{3+}$. Furthermore, as the green phosphor, there are used $Y_3Ga_2(AlO_4)_3:Ce^{3+}$, $Ca_3Sc_2Si_3O_{12}:Ce^{3+}$, $CaSc_2O_4:Ce^{3+}$, $\beta-Si_3N_4:Eu^{2+}$ and $SrSi_2O_2N_2:Eu^{2+}$. As the green phosphor, there are used $Ba_3Si_6O_{12}N_2:Eu^{2+}$, $Sr_3Si_{13}Al_3O_2N_{21}:Eu^{2+}$, $YTbSi_4N_6C:Ce^{3+}$ and $SrGa_2S_4:Eu^{2+}$. As the green phosphor, there are used $Ca_2LaZr_2(AlO_4)_3:Ce^{3+}$, $Ca_2TbZr_2(AlO_4)_3$, $Ca_2TbZr_2(AlO_4)_3:Ce^{3+}$ and $Ca_2TbZr_2(AlO_4)_3:Ce^{3+},Pr^{3+}$. As the green phosphor, there are used $Zn_2SiO_4:Mn^{2+}$ and $MgGa_2O_4:Mn^{2+}$. As the green phosphor, there are used $LaPO_4:Ce^{3+},Tb^{3+}$, $Y_2SiO_4:Ce^{3+}$, $CeMgAl_{11}O_{19}:Tb^{3+}$ and $GdMgB_5O_{10}:Ce^{3+},Tb^{3+}$. As a yellow or orange phosphor, there are used $(Sr,Ba)_2SiO_4:Eu^{2+}$, $(Y,Gd)_3Al_5O_{12}:Ce^{3+}$ and $\alpha-Ca-SiAlON:Eu^{2+}$. As the yellow or orange phosphor, there are used $Y_2Si_4N_6C:Ce^{3+}$, $La_3Si_6N_{11}:Ce^{3+}$ and $Y_3MgAl(AlO_4)_2(SiO_4):Ce^{3+}$. As a red phosphor, there are used $Sr_2Si_5N_8:Eu^{2+}$, $CaAlSiN_3:Eu^{2+}$, $SrAlSi_4N_7:Eu^{2+}$, $CaS:Eu^{2+}$, $La_2O_2S:Eu^3$ and $Y_3Mg_2(AlO_4)(SiO_4)_2:Ce^{3+}$. Moreover, as the red phosphor, there are used $Y_2O_3:Eu^{3+}$, $Y_2O_2S:$ $Eu^{3+}$, $Y(P,V)O_4:Eu^{3+}$ and $YVO_4:Eu^{3+}$. As the red phosphor, there are used $3.5MgO.0.5MgF_2$—$GeO_2:Mn^{4+}$, $K_2SiF_6:Mn^{4+}$ and $GdMgB_5O_{10}:Ce^{3+},Mn^{2+}$.

Note that the phosphor for use is made of only the oxide, whereby a low-cost semiconductor light-emitting device can be realized.

Here, a description is made of an example of a manufacturing method of the semiconductor light-emitting device shown in FIG. 2. First, the solid-state light-emitting element 6 is fixed onto the substrate 5, on which the wiring conductors 7 are formed, by using a packaging technology. Next, the power feed electrodes 8 of the solid-state light-emitting element 6 and the wiring conductors 7 are electrically connected to each other by using a wire bonding technology and the like. Meanwhile, the translucent resin 10 such as silicon resin and the phosphor 2 are sufficiently mixed with each other, whereby phosphor paste adjusted so as to obtain a predetermined viscosity is prepared. A weight ratio of the phosphor 2 in the phosphor paste is set at several percent to several ten percent. Thereafter, the phosphor paste is dropped onto the solid-state light-emitting element 6, and so on, whereby a light extraction surface of the solid-state light-emitting element 6 is covered with the phosphor paste, and the phosphor paste is solidified by being dried, and so on. In such a way, a semiconductor light-emitting device on which the wavelength conversion layer 9 is formed can be obtained.

In the semiconductor light-emitting device formed as described above, when the solid-state light-emitting element 6 is energized and supplied with predetermined electric power, the solid-state light-emitting element 6 emits the primary light as the short-wavelength visible light. That is to say, the solid-state light-emitting element 6 emits the purple light having the light emission peak within the range of 380 nm or more to less than 420 nm, and the blue light having the light emission peak within the range of 420 nm or more to less than 470 nm. This primary light is subjected to the wavelength conversion into the red light by the rare earth aluminum garnet-type phosphor 2.

The primary light is irradiated onto the phosphor 2 contained in the wavelength conversion layer 9, and a part thereof is absorbed by the phosphor 2. The primary light absorbed by the phosphor 2 is subjected, by the phosphor 2, to the wavelength conversion into the light that has moved relatively to the long wavelength side (lower energy side). Then, such wavelength conversion light subjected to the wavelength conversion by the phosphor 2 transmits through the translucent resin 10, and is emitted from the semiconductor light-emitting device. Meanwhile, the primary light that is not absorbed by the phosphor 2 also transmits through the translucent resin 10, and is emitted from the semiconductor light-emitting device. As a result, both of the wavelength conversion light by the phosphor 2 and the primary light that is not absorbed by the phosphor 2 are emitted from the semiconductor light-emitting device. That is to say, a light component obtained by adding and mixing of both of these with each other is outputted from the semiconductor light-emitting device.

Note that the thickness and light transmittance of the wavelength conversion layer 9, the type and mixture ratio of the phosphor 2 contained in the wavelength conversion layer 9, the wavelength of the primary light emitted by the solid-state light-emitting element, and the like can be adjusted appropriately. Therefore, the light source just needs to be designed so that illumination light of a desired light source color, the white color and the like can be obtained. Note that there is also a case where the primary light is entirely absorbed by the phosphor and is subjected to the wavelength conversion thereby, and in this case, the emitted light from the semiconductor light-emitting device becomes only the light subjected to the wavelength conversion by the phosphor.

As described above, the semiconductor light-emitting device according to this embodiment combines the solid-state light-emitting element and the rare earth aluminum garnet-type phosphor, which absorbs the light and emits the bright line-like red light component, with each other. Therefore, the semiconductor light-emitting device according to this embodiment emits at least the bright line-like red component having the light emission peak in the range of 600 nm or more to less than 628 nm. Then, while a ratio of the orange light component in the bright line-like red light component is small, a ratio of the red light component with high visual sensitivity is large. Therefore, the semiconductor light-emitting device of this embodiment can emit the light with a high luminous flux and the red light component with a high output, and accordingly, urges improvement of an appearance of a red object in the illumination device and brightness enhancement of a red pixel in a display device.

Note that the semiconductor light-emitting device of this embodiment is widely usable for the illumination light source, the backlight of the liquid crystal display, the light source for the display device, and the like. That is to say, as mentioned above, unlike the $Eu^{3+}$-activated red phosphor having the conventional garnet structure, the rare earth aluminum garnet-type phosphor of this embodiment is capable of emitting the light having the bright line-like red light component with good color purity. Therefore, in a case of using the phosphor concerned for the illumination light source and the like, an illumination light source, which has high rendering properties and high efficiency, and a display device, which is capable of wide color range-display of a high luminance screen, can be provided.

The illumination light source as described above can be composed by combining the semiconductor light-emitting device of this embodiment, a lighting circuit that actuates the semiconductor light-emitting device concerned, and a connection component such as a base to an illumination fixture with one another. Moreover, if such illumination fixtures are combined with one another according to needs, then an illumination device and an illumination system will also be configured.

The display device can be composed by combining such semiconductor light-emitting devices, which are arranged in a matrix shape, and a signal circuit, which switches ON/OFF these semiconductor light-emitting devices, with each other. Moreover, as the display device, a liquid crystal panel added with an LED backlight function can be mentioned. Specifically, the display device concerned is the device in which the semiconductor light-emitting devices of this embodiment are arranged in a line shape or the matrix shape, and the semiconductor light-emitting devices are used as the backlight. In detail, the display device is composed by combining the backlight, a lighting circuit, which lights the backlight, or a control circuit, which controls ON/OFF of the backlight, and the liquid crystal panel with one another.

As described above, the light-emitting device of this embodiment has good characteristics in terms of the visual sensitivity and visibility of the red light component, and accordingly, can also be widely used for those other than the above-mentioned semiconductor light-emitting device and light source device.

EXAMPLES

A description is made below in more detail of the present invention by examples and comparative examples; however, the present invention is not limited to these examples.

By using a preparation method using a solid phase reaction, rare earth aluminum garnet-type phosphors of the examples and the comparative examples were synthesized, and characteristics thereof were evaluated. Note that, in the examples here, powders of the following compounds were used as raw materials.

Calcium carbonate ($CaCO_3$): purity 2N5, produced by Kanto Chemical Co. Inc.
Europium oxide ($Eu_2O_3$): purity 3N, produced by Shin-Etsu Chemical Co. Ltd.
Yttrium oxide ($Y_2O_3$): purity 3N, produced by Shin-Etsu Chemical Co. Ltd.
Gadolinium oxide ($Gd_2O_3$): purity 3N, produced by Shin-Etsu Chemical Co. Ltd.
Terbium oxide ($Tb_4O_7$): purity 4N, produced by Shin-Etsu Chemical Co. Ltd.
Zirconium oxide ($ZrO_2$): purity 3N, produced by Kanto Chemical Co. Inc.
Aluminum oxide ($\theta$-$Al_2O_3$): purity 4N5, produced by Sumitomo Chemical Co. Ltd.

For the purpose of enhancing reactivity between the raw materials, AKP-G008 produced by Sumitomo Chemical Co. Ltd. was used as the above-described aluminum oxide.

Moreover, in the examples, powders of the following compounds were used: aluminum fluoride ($AlF_3$): purity 3N, produced by Kojundo Chemical Lab. Co. Ltd; and potassium carbonate ($K_2CO_3$): purity 2N5, produced by Kanto Chemical Co. Inc.

Examples 1 to 4

First, the respective raw materials and a reaction accelerator were weighed in ratios shown in Table 1. Next, by using a ball mill, these raw materials and acceleration reactor were sufficiently wet-mixed together with an appropriate amount of pure water. Then, the raw materials thus mixed were moved to a container, and were dried overnight at 120° C. by using a dryer. The mixed raw materials thus dried were milled by a mortar and a pestle, and a firing target raw material was obtained. Thereafter, the firing target raw material was moved to an alumina melting pot added with a lid, and was fired in the atmosphere of 1600° C. for 4 hours by using a box-type electric furnace. In such a way, compounds of Examples 1 to 4 were prepared.

TABLE 1

| | $CaCO_3$ (g) | $Eu_2O_3$ (g) | $Y_2O_3$ (g) | $Gd_2O_3$ (g) | $Tb_4O_7$ (g) | $ZrO_2$ (g) | $Al_2O_3$ (g) | $AlF_3$ (g) | $K_2CO_3$ (g) |
|---|---|---|---|---|---|---|---|---|---|
| Example 1 | 10.009 | 8.857 | — | — | — | 12.322 | 8.019 | 0.063 | 0.035 |
| Example 2 | 10.009 | 0.709 | 5.225 | — | — | 12.322 | 8.019 | 0.063 | 0.035 |
| Example 3 | 10.009 | 0.709 | — | 8.393 | — | 12.322 | 8.019 | 0.063 | 0.035 |
| Example 4 | 10.009 | 0.709 | — | — | 8.598 | 12.322 | 8.019 | 0.063 | 0.035 |

Comparative Examples 1 to 5

As Comparative example 1, publicly known YAG ($Y_3Al_2(AlO_4)_3$) was prepared in a similar way to Examples 1 to 4. Moreover, from phosphor manufacturers, $Y_3Al_2(AlO_4)_3$:$Eu^{3+}$ (Comparative example 2), $Y(P,V)O_4$:$Eu^{3+}$ (Comparative example 3), $Y_2O_2S$:$Eu^{3+}$ (Comparative example 4) and $Y_2O_3$:$Eu^{3+}$ (Comparative example 5) were acquired, and were subjected to the following evaluations.

First, crystal structure analysis was performed for the compounds of Examples 1 to 4 and for YAG of Comparative example 1.

Figure 3:
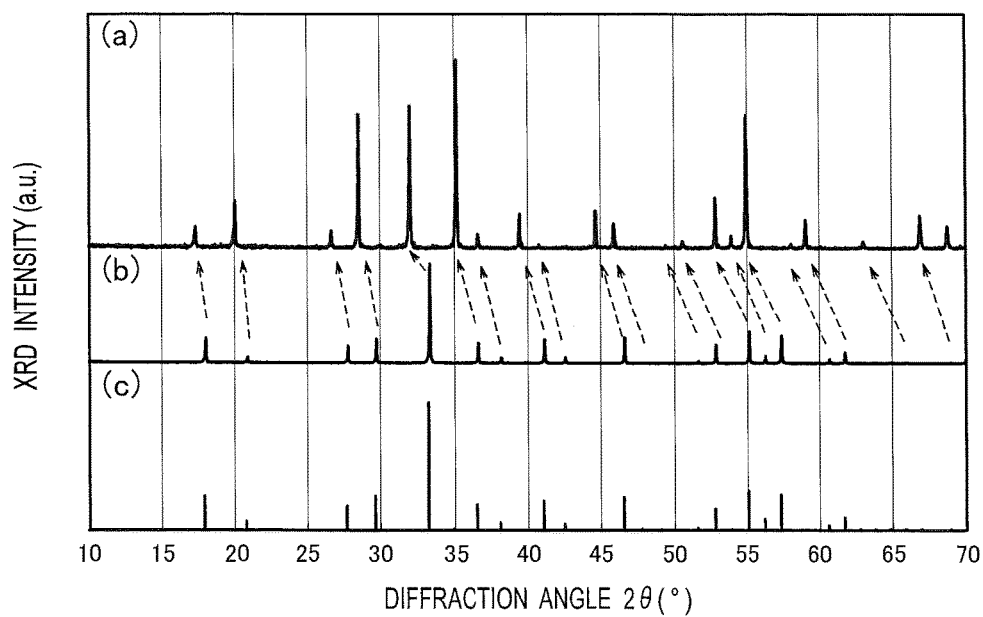
FIG. 3 is a graph showing XRD patterns of compounds in Example 1 and Comparative example 1.

FIGS. 3A to 3C show X-ray diffraction (XRD) patterns of the compounds of Examples 1 and YAG of Comparative example 1. Note that the XRD patterns were evaluated by an X-ray diffraction device (product name: MultiFlex, made by Rigaku Corporation).

In FIGS. 3A to 3C, the XRD pattern of the compound of Example 1 is shown in FIG. 3A. Moreover, the XRD pattern of YAG of Comparative example 1 is shown in FIG. 3B, and the pattern (PDF No. 33-0040) of $Al_5Y_3O_{12}$ registered in the PDF (Power Diffraction Files) is shown in FIG. 3C.

From FIGS. 3A to 3C, when FIG. 3A as Example 1 is compared with FIG. 3B as Comparative example 1 and FIG. 3C as Conventional example, the XRD pattern of Example 1 coincides with the XRD pattern of YAG taken as Comparative example 1 and the pattern of $Al_5Y_3O_{12}$ in terms of shape feature. That is to say, though the XRD pattern of the compound in Example 1 is different from those of Comparative example and Conventional example in intensity ratio of diffraction peaks, the number of diffraction peaks is equal thereto. Moreover, the XRD pattern of Example 1 is formed into a shape in which the respective diffraction peaks in the XRD patterns of Comparative example and Conventional example move to a low angle side as a whole. Note that, in FIGS. 3A to 3C, a correspondence relationship between the diffraction peaks is shown by arrows.

Such coincidence of the XRD patterns as described above indicates that the compound of Example 1 is a compound having the same garnet crystal structure as that of $Y_3Al_2(AlO_4)_3$. Then, the coincidence indicates that the compound of Example 1 is a compound represented by $Ca_2EuZr_2(AlO_4)_3$.

Figure 7:
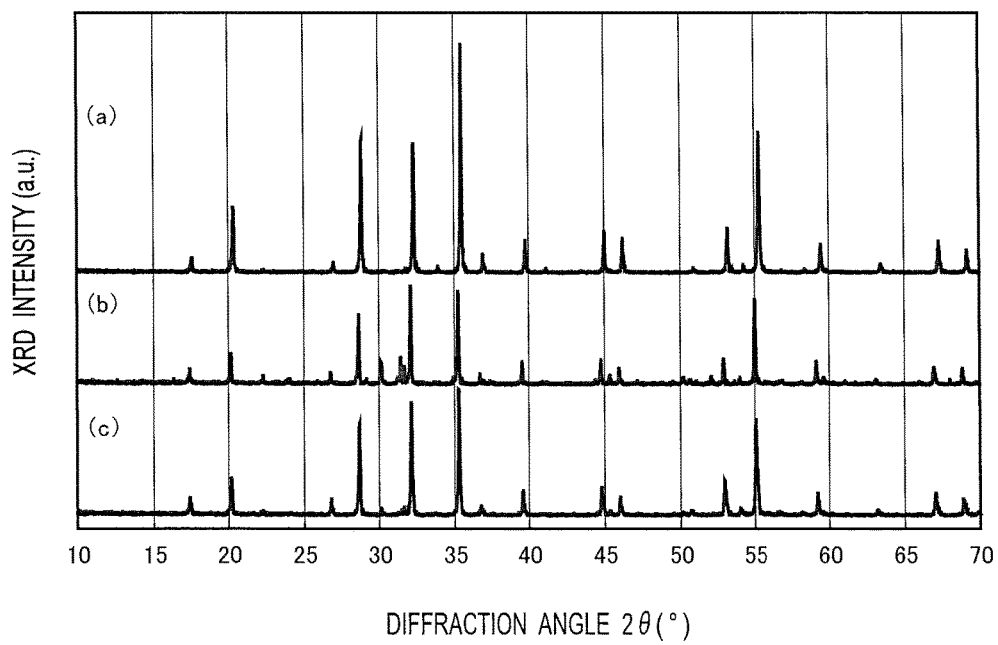
FIGS. 7A to 7C are graphs showing XRD patterns of compounds in Comparative examples 2 to 4.

Moreover, FIG. 7A shows an XRD pattern of a compound of Example 2, FIG. 7B shows an XRD pattern of a compound of Example 3, and FIG. 7C shows an XRD pattern of a compound of Example 4. From FIGS. 3A to 3C and FIGS. 7A to 7C, it is understood that the patterns of FIGS. 7A to 7C are mainly composed of patterns similar to that of the compound of Example 1 shown in FIG. 3A. This matter indicates that the compounds of Example 2, Example 3 and Example 4 include the compound having the garnet structure. Then, from preparation ratios of the raw materials, it is suggested that the compounds of Example 2 and Example 3 include compounds represented by $Ca_2(Y_{0.92}Eu_{0.08})Zr_2(AlO_4)_3$ and $Ca_2(Gd_{0.92}Eu_{0.08})Zr_2(AlO_4)_3$, respectively. Moreover, it is suggested that the compound of Example 4 includes a compound represented by $Ca_2(Tb_{0.92}Eu_{0.08})Zr_2(AlO_4)_3$.

Note that, as a result, in the XRD pattern of FIG. 7B, a pattern different from the pattern of Example 1 shown in FIG. 3A was observed a little. This is conceived to be caused by mixture of a different phase, which results from the fact that production conditions are not optimized.

Next, when the compounds of Examples 1 to 4 are irradiated with an ultraviolet ray (wavelength: 365 nm), red fluorescence with good color purity was observed. That is to say, the compounds of Examples 1 to 4 were phosphors which emit the red light.

Moreover, excitation characteristics and light emission characteristics of the compounds (hereinafter, phosphors) of Examples 1 to 4 were evaluated by using a fluorescence spectrophotometer (product name: FP-6500, made by JASCO Corporation) and an instantaneous multi-photometer system (QE-1100, made by Otsuka Electronics Co., Ltd.) in combination.

Figure 4:
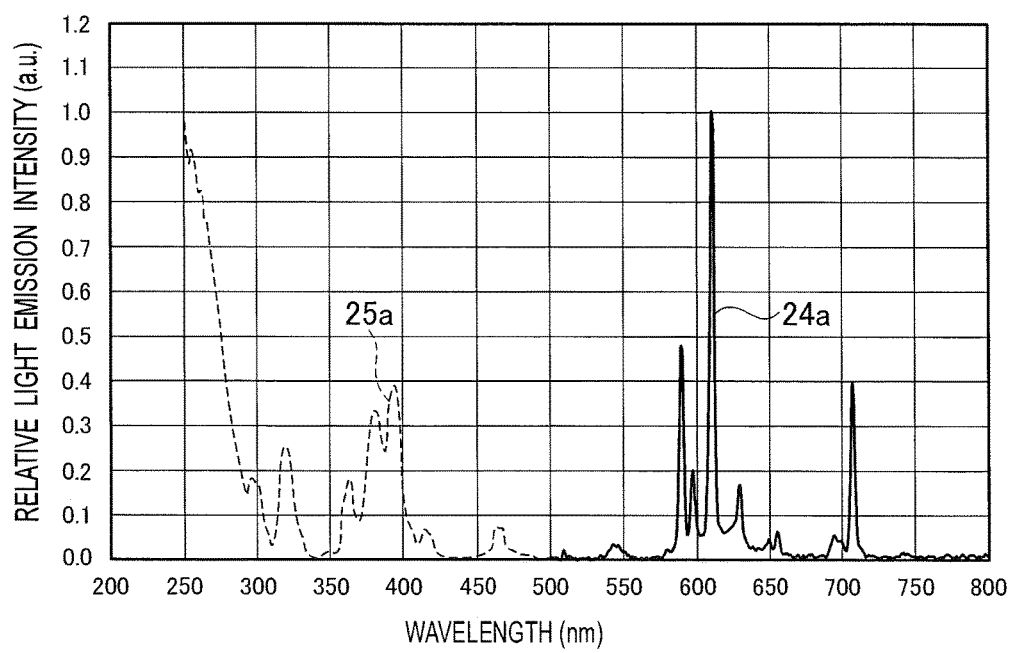
FIG. 4 is a graph showing an excitation spectrum and light emission spectrum of a phosphor in Example 1.
Figure 5:
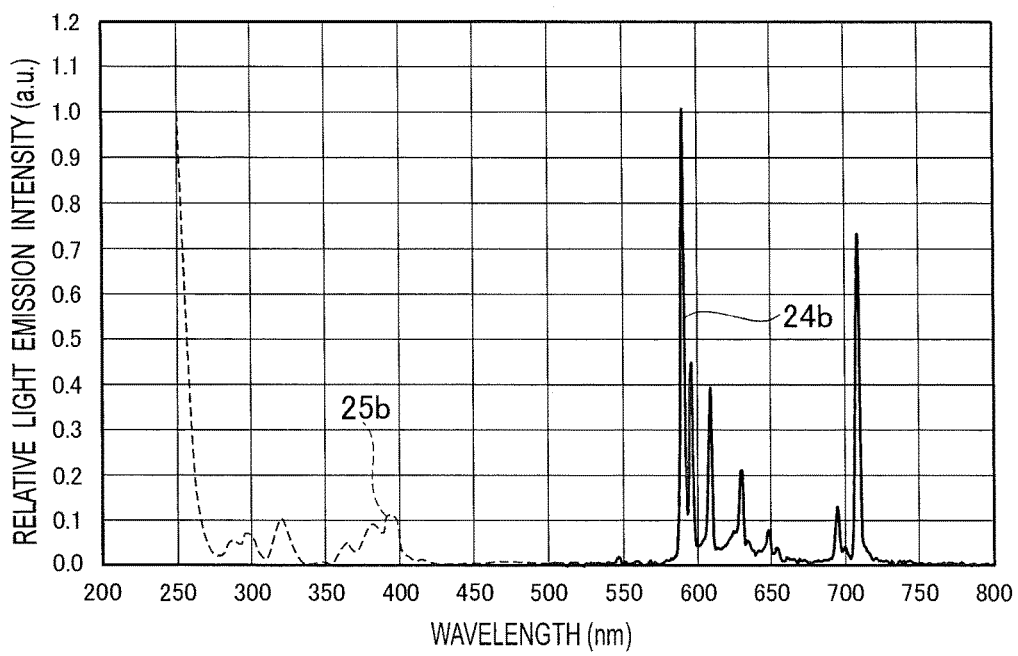
FIG. 5 is a graph showing an excitation spectrum and light emission spectrum of a phosphor in Comparative example 2.

FIG. 4 shows a light emission spectrum 24a and excitation spectrum 25a of the phosphor ($Ca_2EuZr_2(AlO_4)_3$) of Example 1. Moreover, FIG. 5 shows a light emission spectrum 24b and excitation spectrum 25b of the phosphor ($Y_3Al_2(AlO_4)_3:Eu^{3+}$) of Comparative example 2. Note that, for the purpose of enhancing measurement accuracy, the instantaneous multi-photometer system was used for measuring the light emission spectra (24a, 24b), and the fluorescence spectrophotometer was used for measuring an excitation spectra (25a, 25b). Then, an excitation wavelength at a time of measuring the light emission spectra was set at 250 nm, and a monitoring wavelength at a time of measuring the excitation spectra was set at a light emission peak wavelength. Moreover, in FIGS. 4 and 5, the light emission spectra and the excitation spectra are shown while maximum intensities of both thereof are being taken as 1.

As can be guessed from FIG. 4 and FIG. 5, it is regarded that the excitation spectra of the phosphors of Example 1 and Comparative example 2 have the maximum values of the excitation intensities within the ultraviolet wavelength range of less than 300 nm. Specifically, it can be guessed that the excitation spectrum of the phosphor of Example 1 and the excitation spectrum of the phosphor of Comparative example 2 also have the excitation peak within the wavelength range of less than 250 nm.

Figure 6:
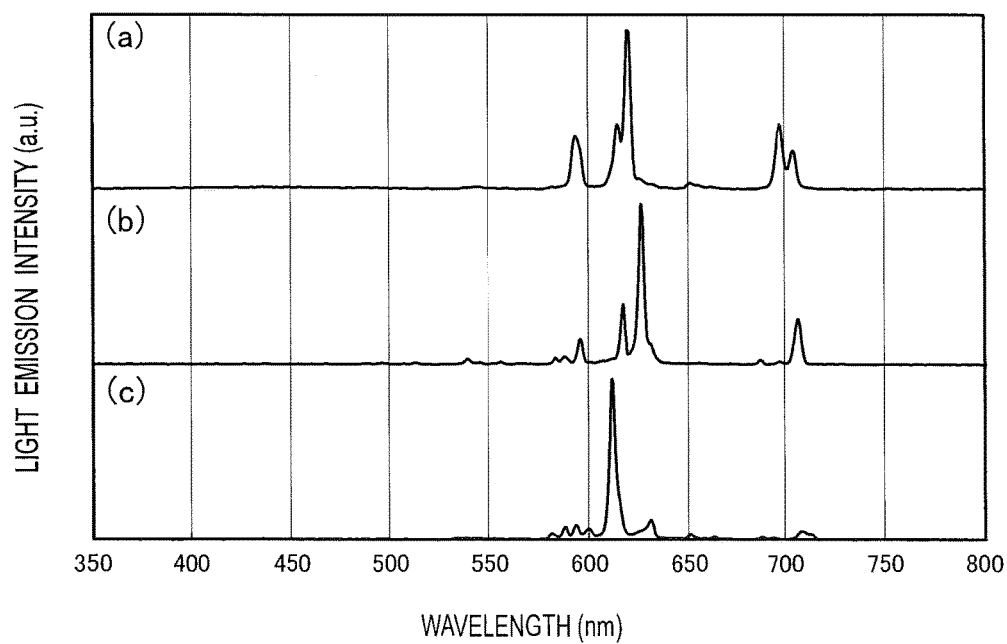
FIGS. 6A to 6C are graphs showing excitation spectra in Comparative examples 3 to 5.

Moreover, from FIGS. 4 and 5, it is revealed that the light emission spectra of the phosphors of Example 1 and Comparative example 2 contain spectrum components derived from the electron energy transition of $Eu^{3+}$. Furthermore, each of the light emission spectra of the phosphors of Example 1 and Comparative example 2 has a shape mainly composed of the light emission spectrum derived from the electron energy transition of $Eu^{3+}$. For reference, FIGS. 6A, 6B and 6C collectively show the light emission spectra of $Y(P,V)O_4:Eu^{3+}$ (Comparative example 3), $Y_2O_2S:Eu^{3+}$ (Comparative example 4), and $Y_2O_3:Eu^{3+}$ (Comparative example 5), respectively.

From FIG. 4 and FIGS. 6A to 6C, the shape of the light emission spectrum of Example 1 is similar to that of the $Eu^{3+}$-activated red phosphor such as $Y(P,V)O_4:Eu^{3+}$ (Comparative example 3, FIG. 6A) and $Y_2O_2S:Eu^{3+}$ (Comparative example 4, FIG. 6B), which is put into practical use in a high pressure mercury lamp and a color electron tube. Then, from FIG. 4 and FIG. 5, in the light emission spectrum of Example 1, relative intensity of the red bright line within the range of 600 nm or more to less than 628 nm is larger than that of the publicly known $Eu^{3+}$-activated phosphor having the garnet-type crystal structure known heretofore.

Moreover, from FIG. 4, with regard to the light emission spectrum of the phosphor of Example 1, the light emission peak wavelength thereof is 610 nm. Furthermore, a half width of the spectrum component present within the wavelength range of 600 nm or more to less than 628 nm is 1 nm or more to less than 10 nm. Further, both of a ⅕ spectrum width and a ⅒ spectrum width of the spectrum component in the range are 1 nm or more to less than 10 nm. In addition, a maximum intensity of the spectrum component of the far-infrared range of 700 nm or more to less than 720 nm, such a far-infrared spectrum component having small visual sensitivity and less contributing to the performance of the light-emitting device, is less than 40% of a maximum intensity of the spectrum component present within the range of 600 nm or more to less than 628 nm. This matter indicates that the phosphor of Example 1 can perform the wavelength conversion into the red light containing the red bright line with high visual sensitivity.

Figure 8:
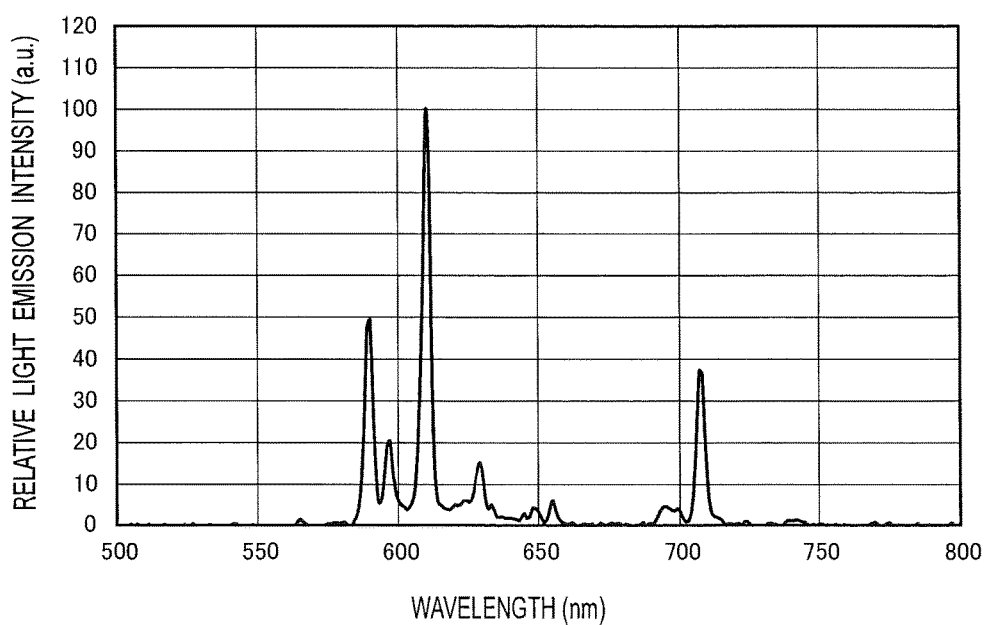
FIG. 8 is a graph showing an excitation spectrum of a phosphor in Example 2.
Figure 9:
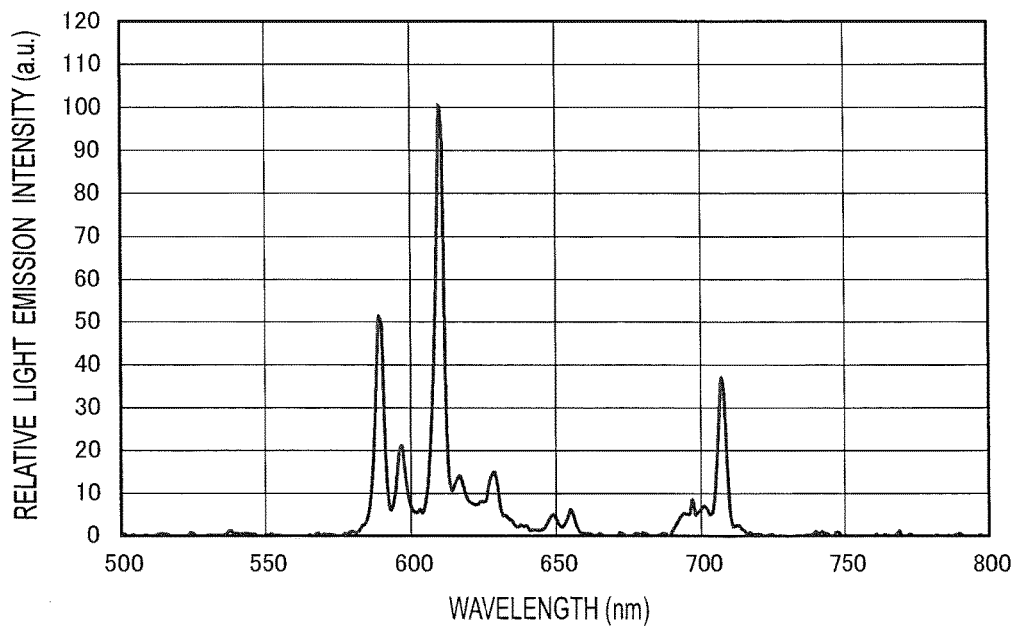
FIG. 9 is a graph showing an excitation spectrum of a phosphor in Example 3.
Figure 10:
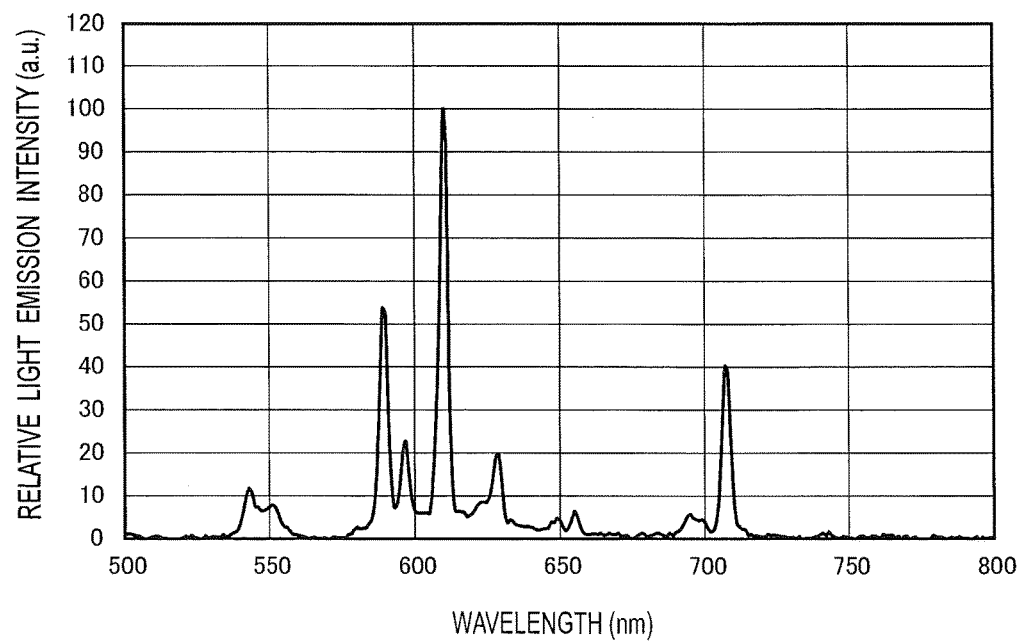
FIG. 10 is a graph showing an excitation spectrum of a phosphor in Example 4.

FIG. 8 shows the light emission spectrum of the phosphor ($Ca_2YZr_2(AlO_4)_3:Eu^{3+}$) of Example 2. Moreover, FIG. 9 shows the light emission spectrum of the phosphor ($Ca_2GdZr_2(AlO_4)_3:Eu^{3+}$) of Example 3. Furthermore, FIG. 10 shows the light emission spectrum of the phosphor ($Ca_2TbZr_2(AlO_4)_3:Eu^{3+}$) of Example 4. Note that the excitation wavelength at the time of measuring the light emission spectrum was set at 250 nm in a similar way to Example 1. Then, in FIGS. 8 to 10, each of the light emission spectra is shown while maximum intensity thereof is being taken as 100. Note that, in FIGS. 8 to 10, the excitation spectra of the compounds of Examples 2 to 4 are omitted; however, were similar to the excitation spectrum of the compound of Example 1.

When FIG. 4 and FIGS. 8 to 10 are compared with each other, the light emission spectra of the phosphors of Examples 2 to 4 had a similar shape to that of the light emission spectrum of the phosphor of Example 1 in the wavelength range of 575 nm or more to 720 nm or less. This matter indicates that the phosphors of Examples 2 to 4 also emit the red light with a good color tone in a similar way to Example 1.

Next, the light emission spectra (FIG. 8 and FIG. 9) of the phosphor of Example 2 and the phosphor of Example 3 and the light emission spectrum (FIG. 4) of the phosphor of Example 1 are compared with each other. As a result, with regard to the maximum height of the near-infrared bright line present within the wavelength range of 700 nm or more to less than 720 nm, the phosphors of Examples 2 and 3 are relatively lower than the phosphor of Example 1. Moreover, the maximum height of the near-infrared bright line in each phosphor of Examples 2 and 3 is smaller than 38% of the maximum height of the red bright line (main bright line) present within the range of 600 nm or more to less than 628 nm. This matter indicates that the phosphors of Example 2 and Example 3 can perform the wavelength conversion into red light containing the red bright line with high visual sensitivity more than the phosphor of Example 1.

Meanwhile, the light emission spectrum (FIG. 10) of the phosphor of Example 4 has a plurality of bright lines in the orange to red wavelength range of 575 nm or more to 720 nm or less in a similar way to Example 1. Moreover, the phosphor of Example 4 contains a spectrum component, which is derived from the electron energy transition of $Tb^{3+}$, in the green wavelength range of 530 nm or more to less than 560 nm. As described above, the phosphor of Example 4 was a single-compound phosphor, which emits two light emission components derived from the electron energy transition of $Eu^{3+}$ and the electron energy transition of $Tb^{3+}$.

The phosphors of Examples 1 to 4 are compounds containing at least Ca, Eu, Zr, Al and oxygen, and the phosphor of Example 1 is a compound containing Eu by 1 mol in 1 mol thereof. Then, the phosphor of Example 1 is a compound having the garnet crystal structure serving as the end component.

Moreover, the phosphors of Examples 1 to 4 are different in composition from the compounds, for example, such as $Ca_2YZr_2(AlO_4)_3$, $Ca_2YHf_2(AlO_4)_3$, $Ca_2LaZr_2(AlO_4)_3$, $Ca_2LuZr_2(AlO_4)_3$ and $Ca_2TbZr_2(AlO_4)_3$. However, the phosphors of Examples 1 to 4 have the garnet crystal structure, and accordingly, can be said to be the compounds isomorphic to these compounds. Then, the compounds of Examples 1 to 4, which are as described above, are man-made fluorescent minerals, each of which functions as the phosphor.

Heretofore, it has been defined that the light composed of the red bright line of $Eu^{3+}$ with good color purity is optimum for the illumination light source or the display device. Then, the phosphor of this embodiment demonstrates that the spectrum-shape light composed of the red bright line of $Eu^{3+}$ can be realized by the garnet-type crystal structure, which has a high degree of freedom in material design, and is configurable by using a variety of elements.

The entire contents of Japanese Patent Application No. 2013-046261 (filed on: Mar. 8, 2013) and Japanese Patent Application No. 2013-083002 (filed on: Apr. 11, 2013) are incorporated herein by reference.

The description has been made above of the contents of the present invention along the embodiments; however, it is self-obvious for those skilled in the art that the present invention is not limited to the description of these, and is modifiable and improvable in various ways.

INDUSTRIAL APPLICABILITY

The inorganic oxide of the present invention has the crystal structure of the garnet, and accordingly, can be used for the man-made jewelry and abrasive, the ceramic material, the electronic material and the like. Moreover, though the phosphor of the present invention is the phosphor activated by $Eu^{3+}$ having the garnet-type crystal structure, the phosphor can emit the narrowband red light component with good color purity. Furthermore, the light-emitting device using this phosphor is useful as an illumination light source, a light-emitting light source, and an electronic instrument.

REFERENCE SIGNS LIST

2 PHOSPHOR
6 SOLID-STATE LIGHT-EMITTING ELEMENT

The invention claimed is:

1. An inorganic oxide, which has a composition represented by $Ca_2EuZr_2(AlO_4)_3$, $Ca_2GdZr_2(AlO_4)_3$:$Eu^{3+}$ or $Ca_2TbZr_2(AlO_4)_3$:$Eu^{3+}$,
wherein $Eu^{3+}$ in a crystal structure of the inorganic oxide functions as a luminescent center which emits a plurality of bright line-like fluorescent components,
wherein a principal bright line of the fluorescent component is present within a wavelength range of 600 nm or more to less than 628 nm, and
a maximum height of the bright line present within a wavelength range of 700 nm or more to less than 720 nm is less than 60% of a maximum height of the principal bright line.

2. The inorganic oxide according to claim 1, wherein a number of Eu moles in 1 mol of the inorganic oxide exceeds 0 mol and is less than 0.1 mol.

3. A solid solution of the inorganic oxide according to claim 1 and a compound that is solid-solved with the Inorganic oxide and is different from the inorganic oxide in composition,
wherein a number of Eu moles in 1 mol of the solid solution is 0.1 mol or more to less than 3 moles, and
a crystal structure of the solid solution is the garnet-type structure.

4. The solid solution according to claim 3,
wherein the solid solution has a composition represented by General formula:

$$A_3D_2(EG_4)_3$$

where A includes Ca and Eu and at least one element selected from alkali metal, alkali earth metal and a rare earth element, D includes the element represented by X and at least one element selected from Mg, Sc, V, Zr, Hf, Zn, Al, Ga, In, Ge and Sn, E includes Al and at least one element selected from Zn, Al, Si, Ge and P, and G includes O.

5. A phosphor comprising:
the inorganic oxide according to claim 1.

6. The phosphor according to claim 5, wherein the inorganic oxide forms a main skeleton of a crystal.

7. The phosphor according to claim 5, wherein a ⅕ spectrum width of a light emission spectrum serving as the principal bright line is 1 nm or more to less than 10 nm.

8. A light-emitting device comprising:
the phosphor according to claim 5.

9. A phosphor comprising:
the solid solution according to claim 3.

10. The phosphor according to claim 9, wherein the solid solution forms a main skeleton of a crystal.

11. The phosphor according to claim 9, wherein a ⅕ spectrum width of a light emission spectrum serving as the principal bright line is 1 nm or more to less than 10 nm.

12. A light-emitting device comprising:
the phosphor according to claim 9.

* * * * *